US012273059B2

(12) United States Patent
Baeurle

(10) Patent No.: US 12,273,059 B2
(45) Date of Patent: Apr. 8, 2025

(54) EXTERNAL ADJUSTMENT OF A DRIVE CONTROL OF A SWITCH

(71) Applicant: POWER INTEGRATIONS, INC., San Jose, CA (US)

(72) Inventor: Stefan Baeurle, San Jose, CA (US)

(73) Assignee: POWER INTEGRATIONS, INC., San Jose, CA (US)

( * ) Notice: Subject to any disclaimer, the term of this patent is extended or adjusted under 35 U.S.C. 154(b) by 106 days.

(21) Appl. No.: 18/128,885

(22) Filed: Mar. 30, 2023

(65) Prior Publication Data

US 2023/0238909 A1     Jul. 27, 2023

Related U.S. Application Data

(63) Continuation of application No. 17/178,749, filed on Feb. 18, 2021, now Pat. No. 11,646,689, which is a continuation of application No. 16/570,419, filed on Sep. 23, 2019, now Pat. No. 10,998,843.

(51) Int. Cl.
*H02P 27/08*     (2006.01)

(52) U.S. Cl.
CPC .................. *H02P 27/085* (2013.01)

(58) Field of Classification Search
CPC ........ H02P 27/085; H02P 25/32; H02P 27/06; H02P 27/04; H02P 27/08; Y02B 70/10; H02M 1/0054; H02M 1/08; H02M 1/32; H02M 7/5387; H02M 1/088;
(Continued)

(56) References Cited

U.S. PATENT DOCUMENTS

| 4,736,126 A | 4/1988 | Susak |
| 4,766,366 A | 8/1988 | Davis |
| 4,808,853 A | 2/1989 | Taylor |

(Continued)

FOREIGN PATENT DOCUMENTS

| EP | 1255412 A2 | 11/2002 |
| EP | 3116179 A1 | 1/2017 |

(Continued)

OTHER PUBLICATIONS

Japanese Application No. 2020-151922; "Notification of Reasons for Refusal with Search Report and Machine Translations"; mailed Jun. 10, 2024; 80 pages.

(Continued)

*Primary Examiner* — David Luo
(74) *Attorney, Agent, or Firm* — Karina Martha G. Li

(57) ABSTRACT

A switch controller coupled to control a transistor. The switch controller comprising an interface coupled to receive a command signal in response to an event sensed in a control system. The command signal is representative of a first command to control the transistor with a first drive strength or a second command to control the transistor with a second drive strength. The switch controller is coupled to adjust a fall time or a rise time, or to adjust both the fall time and the rise time, of a voltage across the transistor in response to the command signal. The fall time or the rise time, or both the fall time and the rise time in response to the second command is shorter than the fall time or the rise time, or both the fall time and the rise time in response to the first command.

25 Claims, 10 Drawing Sheets

(58) Field of Classification Search
CPC .......... H02M 7/53871; H02M 7/53873; H03K 2017/0806; H03K 17/0412; H03K 17/162
USPC ................................................ 318/503, 494
See application file for complete search history.

(56) References Cited

U.S. PATENT DOCUMENTS

| | | | |
|---|---|---|---|
| 5,742,183 A | 4/1998 | Kuroda | |
| 5,923,209 A | 7/1999 | Price et al. | |
| 5,963,438 A | 10/1999 | Chen | |
| 6,051,893 A | 4/2000 | Yamamoto et al. | |
| 6,333,665 B1 | 12/2001 | Toshiba | |
| 6,339,309 B1 | 1/2002 | Bixel et al. | |
| 7,034,600 B2 | 4/2006 | Scheikl | |
| 7,233,191 B2 | 6/2007 | Wang et al. | |
| 7,239,119 B2 | 7/2007 | Baurle et al. | |
| 7,242,857 B2 * | 7/2007 | Wu | H02P 29/50 318/400.29 |
| 7,417,409 B2 | 8/2008 | Partridge | |
| 7,489,120 B2 | 2/2009 | Matthew | |
| 7,535,130 B2 | 5/2009 | Djengurian et al. | |
| 7,616,459 B2 | 11/2009 | Huynh et al. | |
| 8,144,484 B2 | 3/2012 | Disney | |
| 8,207,760 B2 | 6/2012 | Pham | |
| 8,264,858 B2 | 9/2012 | Disney | |
| 8,456,218 B2 | 6/2013 | Mazzola et al. | |
| 8,985,850 B1 | 3/2015 | Godbole et al. | |
| 9,019,001 B2 | 4/2015 | Kelley et al. | |
| 9,366,717 B2 | 6/2016 | Ratz | |
| 9,750,102 B1 | 8/2017 | Mao et al. | |
| 9,825,625 B2 | 11/2017 | Thalheim | |
| 9,954,461 B1 | 4/2018 | Duvnjak | |
| 9,983,239 B2 | 5/2018 | Mayell | |
| 10,171,071 B2 | 1/2019 | Ratz | |
| 10,181,813 B2 | 1/2019 | Baurle et al. | |
| 10,384,561 B2 | 8/2019 | Yang et al. | |
| 11,223,270 B2 | 1/2022 | Rajesh et al. | |
| 2004/0036511 A1 | 2/2004 | Otoshi et al. | |
| 2007/0040520 A1 | 2/2007 | De et al. | |
| 2012/0206123 A1 | 8/2012 | Mulligan et al. | |
| 2015/0326008 A1 | 11/2015 | Bäurle et al. | |
| 2016/0329751 A1 | 11/2016 | Mach et al. | |
| 2018/0123579 A1 | 5/2018 | Fink et al. | |
| 2018/0150093 A1 | 5/2018 | Poletto et al. | |
| 2018/0302017 A1 | 10/2018 | Baurle et al. | |

FOREIGN PATENT DOCUMENTS

| | | |
|---|---|---|
| EP | 3496348 A1 | 6/2019 |
| JP | 2009011049 A | 1/2009 |
| JP | 2018085916 A | 5/2018 |
| JP | 2018098849 A | 6/2018 |
| JP | 2019013083 A | 1/2019 |
| JP | 2019103136 A | 6/2019 |
| WO | 2011149632 A2 | 12/2011 |
| WO | 2018080508 A1 | 5/2018 |

OTHER PUBLICATIONS

EP Application No. 22191266.0, "Extended European Search Report Mailed Nov. 15, 2022", Nov. 15, 2022, 10 pages.
European Patent Application No. 20195732.1, Communication under Rule 71(3) EPC, Mailed May 5, 2022, 67 pages.
Extended European Search Report for Application No. 20195732.1, Feb. 9, 2021, 91 pages.
U.S. Appl. No. 17/178,749, Non-Final Office Action, Mailed Aug. 12, 2022, 6 pages.
EP Application No. 22191266.0; "Communication pursuant to Article 94(3) EPC" mailed Dec. 5, 2024; 8 pages.
Japanese Application No. 2020-151922; "Decision of Refusal with Machine Translation"; mailed Nov. 14, 2024; 6 pages.
ON Semiconductor; "MC33153—Single IGBT Gate Driver—Datasheet", Aug. 31, 2013, Rev 8, XP093229324, 16 pages.

* cited by examiner

EXTERNAL ADJUSTMENT OF A DRIVE CONTROL OF A SWITCH

CROSS-REFERENCE TO RELATED APPLICATIONS

This application is a continuation of U.S. application Ser. No. 17/178,749, filed Feb. 18, 2021, currently pending, which is a continuation of U.S. application Ser. No. 16/570,419, filed Sep. 23, 2019, and issued as U.S. Pat. No. 10,998,843 on May 4, 2021. U.S. application Ser. Nos. 16/570,419 and 17/178,749 are incorporated herein by reference in their entirety.

BACKGROUND OF THE INVENTION

1. Field of the Invention

The present invention relates generally to a switch controller for a semiconductor switch, and more specifically to a switch controller which may be controlled by a user or a system controller.

2. Discussion of the Related Art

Household and industrial appliances such as ventilation fans, cooling systems, refrigerators, dishwashers, washer/dryer machines, and many other white products/goods typically utilize electric motors that transfer energy from an electrical source to a mechanical load. Electrical energy for driving the electric motors is provided through a drive system, which draws electrical energy from an electrical source (e.g., from an ac low frequency source). The electrical energy received from the electrical source is processed through a power converter, and converted to a desired form of electrical energy that is supplied to the motor to achieve the desired mechanical output. The desired mechanical output of the motor may be for example the speed of the motor, the torque, or the position of a motor shaft.

Motors and their related circuitries such as motor drives represent a large portion of utility network loads. The functionality, efficiency, size, and price of motor drives are challenging and are competitive factors that suppliers of these products consider. The function of a power converter in a motor drive includes providing the input electrical signals to the motor such as voltage, current, frequency, and phase for a desired mechanical output load motion (e.g., spin/force) on the motor shaft. The power converter in one example may be an inverter transferring a dc input to an ac output of desired voltage, current, frequency, and phase and generally includes one or more switches to control the transfer of energy. Each switch is controlled by a switch controller for the power converter.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
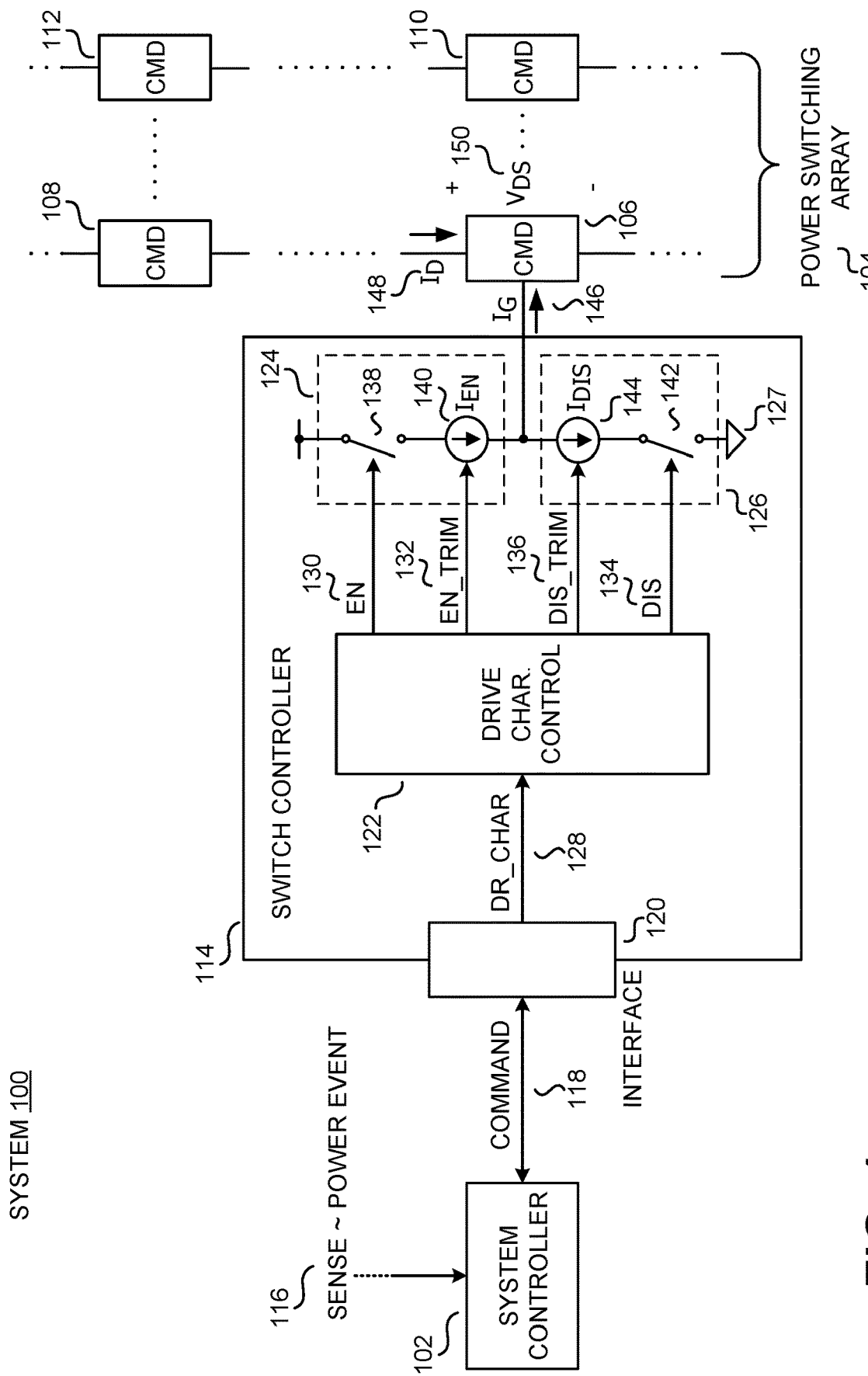
FIG. 1 is a functional block diagram of a system with a system controller which adjusts the drive characteristics of a switch in accordance with embodiments of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

In the context of the present application, when a transistor is in an "off state", or "off", the transistor does not substantially conduct current. Conversely, when a transistor is in an "on state", or "on", the transistor is able to substantially conduct current. By way of example, in one embodiment, a high-voltage transistor comprises an N-channel metal-oxide-semiconductor field-effect transistor (NMOS) with the high-voltage being supported between the first terminal, a drain, and the second terminal, a source. In another embodiment, a high-voltage transistor comprises an insulated-gate bipolar transistor (IGBT) with the high-voltage being supported between the first terminal, a collector, and the second terminal, an emitter. For purposes of this disclosure, "ground" or "ground potential" refers to a reference voltage or potential against which all other voltages or potentials of an electronic circuit or integrated circuit (IC) are defined or measured. In one example, the transistor or switch may also be referred to as a conductivity modulated device which may be controlled to conduct various amounts of current.

Inverters with half-bridge switching configurations are commonly used with motor drives. Instead of implementing a full bridge switching configuration, utilizing a half-bridge switching circuit with low-side and high-side control blocks (also referred to as a low-side switch controller and high-side switch controller) inside one single package (e.g., a module) allows support for multiphase inverters, such as single-phase and 3-phase inverters, that provide increased layout flexibility as well as simplified thermal management for each module. Utilization of a modular half-bridge circuit structure for a motor drive inverter may reduce overall system cost because of a variety of reasons. Each switch of the half-bridge circuit structure is generally controlled by a switch controller which in turn is controlled by a system controller. The switches are controlled by the switch controllers to regulate the energy delivery in response to signals received from the system controller and/or a user.

Conductivity modulated devices, such as transistors, maybe be utilized for the one or more switches in a power converter, such as an inverter. Typical losses related to conductivity modulated devices are conduction losses and switching losses (also referred to as crossover losses). When the conductivity modulated device conducts current, the voltage across the conductivity modulated device in response to the current through the conductivity modulated device generates conduction loss. Switching losses are generally associated with the losses, which occur while the conductivity modulated device is transitioning between an ON state and an OFF state or vice versa.

In general, a conductivity modulated device takes time to transition from an ON state to an OFF state and vice versa in response to a drive signal that is provided to a control terminal of the conductivity modulated device. The control terminal of a field effect transistor (FET), insulated-gate bipolar transistor, or a SiC based transistor is generally referred to as the gate terminal. The control terminal of a bipolar junction transistor (BJT) is generally referred to as the base terminal. The time for the conductivity modulated device to transition from an OFF state to an ON state may be referred to as the turn-on time whereas the time for the conductivity modulated device to transition from an ON state to an OFF state may be referred to as the turn-off time. Switching/crossover losses occur during this transition time, and they may be lessened by reducing the duration of the turn-on and turn-off times. In addition, shorter turn-on and turn-off times generally correspond to reduced temperature of the conductivity modulated device (and therefore the system). However, shorter turn-on and turn-off times also generally correspond with increased system level electromagnetic interference (EMI). As such, there is generally a trade-off between EMI, switching losses, and temperature.

The duration of the turn-on and turn-off time of a conductivity modulated device is related to the characteristics of the drive signal provided to the control terminal of the conductivity modulated device. It should be appreciated that conductivity modulated devices may be voltage controlled or current controlled at the gate terminal. Voltage controlled conductivity modulated devices typically would be controlled with a voltage source and a drive resistor (also referred to as a gate resistor) and the drive current for the conductivity modulated device is determined by the voltage drop across the control resistor. In other words, the value of the voltage source controls the drive characteristics of the conductivity modulated device. Current controlled conductivity devices could include a current source and the drive current for the conductivity modulated device is determined by the charge delivered by the current source. In other words, the value of the current source controls the drive characteristics of the conductivity modulated device. In one example, the drive signal is a current characterized by its magnitude, direction, and rate of change. The characteristics of the drive current determine the electric charge that passes through the control terminal of the conductivity modulated device, and it is the electric charge that ultimately modulates the conductivity of the conductivity modulated device. Drive current of higher magnitude corresponds to more charge in less time at the control terminal, resulting in shorter turn-on and/or turn-off time and lower switching/crossover losses. There may be conditions in a system, such as a motor drive, where the system controller could determine a need to deliver more power temporarily to a load without exceeding a maximum allowable temperature of the switching devices. The controller can reduce the turn-on and/or turn-off times of the switching devices to provide the temporary increase in power. Further, the system can be configured to tolerate higher electrical noise for the time the higher power is required. In embodiments of the present invention, the characteristics of a driver for a conductivity modulated device may be adjusted by a system controller and/or a user through the switch controller and/or a dedicated hardware sensor. The adjusted drive could increase or decrease the power delivered to the load within the bounds of other system parameters. In other words, a user and/or a system controller could adjust the drive characteristics of a conductivity modulated device to meet changing requirements. This could be accomplished by a switch controller which includes a drive characteristic control which can receive a drive characteristic signal representative of one or more drive characteristics of the conductivity modulated device. Further, in one embodiment, the conductivity modulated device may be adjusted in real time by a system controller and/or a user and as such, the drive characteristics of a conductivity modulated device may be adjusted on demand to meet changing requirements.

FIG. 1 illustrates a system 100 with a system controller 102 which adjusts the drive characteristics of a conductivity modulated device 106, in accordance with embodiments of the present disclosure. System 100 includes a system controller 102 and a power switching array 104. The power switching array 104 can include one or more conductivity modulated devices. As shown, the power switching array 104 includes conductivity modulated devices 106, 108, 110, and 112. The conductivity modulated devices 106, 108, 110, and 112 are illustrated as coupled together by dotted lines to emphasize that the power switching array 104 could be coupled in various configurations. For example, the conductivity modulated devices in the power switching array 104 could be representative of transistors of one or more inverters with half-bridge switching configurations or other power converter topologies. In another example, the conductivity modulated devices in the power switching array 104 could be representative of one or more inverter transistors with full-bridge switching configurations.

Each conductivity modulated device 106, 108, 110, and 112 is controlled by a switch controller, however for ease of explanation, only the switch controller 114 for conductivity modulated device 106 is illustrated. The voltage across the conductivity modulated device 106 is shown as voltage $V_{DS}$ 150 (also referred to as drain-source voltage $V_{DS}$ 150) while the conducted current of the conductivity modulated device 106 is current $I_D$ 148 (also referred to as drain current $I_D$ 148). In the example shown, the conductivity modulated device 106 is a current controlled device. The control current for the conductivity modulated device 106 is shown as current $I_G$ 146 (also referred to as gate current $I_G$ 146). The conductivity modulated device may be a transistor, such as a metal-oxide-semiconductor field-effect transistor (MOSFET), bipolar transistor, injection enhancement gate transistors (IEGT), insulated-gate bipolar transistor (IGBT) and gate turn-off thyristor (GTO). Further, the conductivity modulated device may be based on silicon (Si), gallium nitride (GaN), or silicon carbide (SiC) semiconductors.

The system controller 102 couples to the switch controller 114 through interface 120. In one example, the interface 120 galvanically isolates the system controller 102 from the switch controller 114. In another example, the interface 120 does not galvanically isolate the system controller 102 from the switch controller 114. As shown, the system controller 102 receives a sense signal 116 representative of a power event. In one example, the power event may be an indication to the system controller 102 to provide increased power to a load, such as a motor. In one embodiment, the sensed power event may indicate to the system controller 102 to adjust the drive characteristics of the conductivity modulated device 106. In on example, the system controller 102 adjusts the drive characteristics of the conductivity modulated device 106 by increasing the magnitude of the drive current (e.g. gate current $I_G$ 146) of the conductivity modulated device 106. Further, in one embodiment the system controller 102 adjusts the drive characteristics of the conductivity modulated device 106 by increasing the magnitude of the drive current during either the turn-on time, the turn-off time, or both. In one example, the drive current may also be referred to as the drive strength with greater magnitude of drive currents corresponding to greater drive strength. Or in other words, the power event may indicate to the system controller 102 to decrease turn-on time and/or turn-off time by increasing the magnitude of the gate current $I_G$ 146 to decrease the rise time and/or fall time of the drain current $I_D$ 148 of the conductivity modulated device 106. In some embodiments, the power event may indicate to the system controller 102 to decrease turn-on time and/or turn-off time by increasing the magnitude of the gate current $I_G$ 146 to decrease the fall time and/or rise time of the drain-source voltage $V_{DS}$ 150. For example, the system controller 102 decreases turn-on time and/or turn-off time by modulating the value of currents $I_{EN}$ and his of current sources 140 and 144. One example of a sensed power event which would increase the magnitude of the gate current $I_G$ 146 could include an outdoor air conditioning fan during startup that may have to overcome possible wind blowing conditions. Another example of a sensed power event could include a dishwasher water pump which has to pump a large amount of water in case the drain for the dishwasher has unexpectedly flooded. A further example of a sensed power event could include a refrigerator during initial installation to cool itself to the desired temperature, also known as a cool-down period.

In the embodiment shown in FIG. 1, system controller 102 outputs a command signal 118 to the switch controller 114. In one example, the command signal 118 is outputted in response to the received sense signal 116. The command signal 118 is representative of one or more commands for the switch controller 114 by the system controller 102 and vice versa. In one example, the communication between the system controller 102 and the switch controller 114 is bidirectional. Example commands communicated by and/or to the system controller 102 could include a "status inquiry" command in which the system controller 102 pings the switch controller 114 for the "status" of the switch controller 114, such as the information stored in a status register of the switch controller. Another example command communicated with the system controller 102 could include a "fault" command in which the switch controller 114 has sensed a fault condition (such as overcurrent, overvoltage, overheating, etc) in the system 100 and communicates the fault to the system controller 102. In general, the switch controller 114 responds to a sensed fault by turning off the conductivity modulated device 106. A further example command communicated by the system controller 102 could include a "reset" command in which the switch controller 114 is restarted or turned on. In embodiments of the present disclosure, the system controller 102 communicates an adjustment command representative of adjusting one or more drive characteristics of conductivity modulated device 106. An example drive characteristic includes the magnitude of the gate current $I_G$ 146 (e.g. drive strength) which is related to the rise time and/or fall time of the drain current $I_D$ 148 and the drain-source voltage $V_{DS}$ 150. The magnitude of the gate current $I_G$ 146 may be varied by modulating the values of currents $I_{EN}$ and $I_{DIS}$ by current sources 140 and 144. Another example drive characteristic could include the duration which the conductivity modulated device 106 is driven by the gate current $I_G$ 146. A further example drive characteristic could include the frequency which the conductivity modulated device 106 is driven by the gate current $I_G$ 146. For example, the gate current $I_G$ 146 could be a pulsed signal which may be pulse width modulated (PWM) or pulse frequency modulated (PFM) in response to the command signal 118. In some embodiments, the command signal 118 could be representative of driving the conductivity modulated device 106 at a first magnitude of gate current $I_G$ 146 or a second magnitude of gate current $I_G$ 146, where the second magnitude is greater than the first magnitude. The command signal 118 could be a voltage signal or a current signal. In one example, the command signal 118 could be representative of a digital word. Further, the system controller 102 could apply coding to the command signal 118.

The interface 120 receives the command signal 118 and interprets/demodulates the command signal 118 to output the drive characteristic signal 128. In embodiments, the drive characteristic signal 128 is representative of one or more drive characteristics for the conductivity modulated device 106. The switch controller 114 also includes a drive characteristic control 122 and drive elements 124 and 126. As shown, the interface 120 is coupled to and outputs the drive characteristic signal 128 to the drive characteristic control 122. Drive characteristic control 122 is coupled to drive elements 124, 126 and controls drive elements 124, 126 to enable or disable (i.e. turn on or turn off) the conductivity modulated device 106. In embodiments, the drive characteristic control 122 controls drive elements 124, 126 in response to the drive characteristic signal 128. Further, the drive characteristic control 122 controls drive elements 124, 126 to enable or disable (i.e. turn on or turn off) the conductivity modulated device 106 with the one or more drive characteristics provided by the drive characteristic signal 128. As shown in FIG. 1, the drive characteristic control 122 outputs an enable signal EN 130 and disable signal DIS 134 to turn on or turn off the conductivity modulated device 106. In one example, the enable signal EN 130 and the disable signal DIS 134 could be outputted in response to the command signal 118 from the system controller 102 via the drive characteristic signal 128. In another example, the enable signal EN 130 and the disable signal DIS 134 could be outputted in response to one or more signals, separate from command signal 118, received by the switch controller 114. Further, the drive characteristic control 122 could receive the one or more signals, separate from the command signal 118, and outputs the applicable enable signal EN 130 or disable signal DIS 134 to turn on or turn off the conductivity modulated device 106

As will be discussed further, in one embodiment the drive characteristic control 122 adjusts the drive strength (e.g. drive current) of the conductivity modulated device 106 by adjusting the current provided by drive elements 124, 126. As shown, the drive characteristic control 122 outputs the enable trim signal 132 and the disable trim signal 136 to the drive elements 124 and 126, respectively, which adjusts the magnitude of the gate current $I_G$ 146 and the subsequent turn-on and turn-off times of the conductivity modulated device 106.

Drive element 124 includes switch 138 and current source 140 with current $I_{EN}$ to enable the conductivity modulated device 106. Current source 140 is coupled to the conductivity modulated device 106 to provide current to the control terminal (e.g. gate). Drive element 126 includes switch 142 and current source 144 with current his to disable the conductivity modulated device 106. Current source 144 is coupled to the conductivity modulated device 106 to sink current from the control terminal (e.g. gate). In some embodiments, current sources 140 and 144 are trimmable current sources in which the magnitudes of current $I_{EN}$ and current his are responsive to the drive characteristic signal 128.

Drive characteristic control 122 is coupled to output an enable signal EN 130 and an enable trim signal 132 to drive element 124. To enable the conductivity modulated device 106 to conduct (i.e. turn on), the drive characteristic control 122 outputs the enable signal EN 130 to turn on the switch 138 and turns off switch 140. The current $I_{EN}$ is sourced to the control terminal of the conductivity modulated device 106 and the magnitude of the gate current $I_G$ 146 of the conductivity modulated device 106 is substantially equal to current $I_{EN}$. In one example, the enable signal EN 130 may be a rectangular pulse waveform with varying lengths of logic high and logic low sections. Logic high sections could correspond to the switch 138 being on while logic low sections could correspond to the switch 138 being off (or vice versa). In one embodiment, the drive characteristic control 122 outputs the enable signal EN 130 in response to a signal separate from the command signal 118 and the drive characteristic signal 128. Drive characteristic control 122 outputs an enable trim signal 132 to adjust the value of the current $I_{EN}$ and therefore the magnitude of the gate current $I_G$ 146. In embodiments of the present disclosure enable trim signal 132 is responsive to the drive characteristic signal 128. The enable trim signal 132 may be a voltage or current signal, with the magnitude of the current $I_{EN}$ corresponding to the value of the enable trim signal. In one example of the present disclosure, the enable trim signal 132 can trim the value of the current $I_{EN}$ to a first current value $I_1$ or a second current value $I_2$, however it should be appreciated that the enable trim signal 132 can trim the value of the current $I_{EN}$ to a plurality of current values. The magnitude of the gate current $I_G$ 146 controls the fall time of the drain-source voltage $V_{DS}$ 150 and the turn-on time of the conductivity modulated device 106 when switch 138 is on and current source 140 is providing current to the conductivity modulated device 106 while switch 142 is off. As such, the system controller 102 can adjust the drive characteristics, such as the rise time of the drain current $I_D$ 148 and/or the fall time of the drain-source voltage $V_{DS}$ 150 and the turn-on time, of a conductivity modulated device 106.

Similarly, the drive characteristic control 122 is configured to output a disable signal DIS 134 and disable trim signal 136 to drive element 126. To disable the conductivity modulated device 106 from conducting (i.e. turn off), the drive characteristic control 122 outputs the disable signal DIS 134 to turn on the switch 142 and turns off switch 138. The amount of current sinked from the control terminal of the conductivity modulated device 106 is limited by the value of current $I_{DIS}$ provided by current source 144. In one example, the disable signal DIS 134 is a rectangular pulse waveform with varying lengths of logic high or logic low sections. Logic high sections could correspond to the switch 142 being on while logic low sections could correspond to the switch 142 being off (or vice versa). In one example, the disable signal DIS 134 is substantially the inverse of the enable signal EN 130. In one embodiment, the drive characteristic control 122 outputs the disable signal DIS 136 in response to a signal separate from the command signal 118 and the drive characteristic signal 128. The drive characteristic control 122 outputs the disable trim signal 136 to adjust the value of the current $I_{DIS}$ and therefore the magnitude of the gate current $I_G$ 146. In embodiments of the present disclosure, disable trim signal 136 is responsive to the drive characteristic signal 128. The disable trim signal 136 may be a voltage or current signal, with the magnitude of the current $I_{DIS}$ corresponding to the value of the disable trim signal 136. In one example of the present disclosure, the disable trim signal 136 can trim the value of the current $I_{DIS}$ to a first current $I_1$ value or a second current value $I_2$, however it should be appreciated that the disable trim signal 132 can trim the value of the current $I_{DIS}$ to a plurality of current values. The magnitude of the gate current $I_G$ 146 controls the fall time of the drain current $I_D$ 148 and the subsequent turn-off time of the conductivity modulated device 106. As such, the system controller 102 can adjust the drive characteristics, such as the fall time of the drain current $I_D$ 148 and the subsequent turn-off time, of a conductivity modulated device 106.

In another embodiment, the drive characteristic control 122 may adjust the drive characteristics for the conductivity modulated device 106 by pulse width modulating or pulse frequency modulating the enable signal EN 130 or the disable signal DIS 134. By pulse width modulating or pulse frequency modulating the enable signal EN 130 or the disable signal DIS 134, the drive characteristic control 122 adjusts the average magnitude of the gate current $I_G$ 146. As such the rise time and/or fall time of the drain-source voltage $V_{DS}$ 150 or the drain current $I_D$ 148 may be adjusted and subsequent turn-on and/or turn-off times of the conductivity modulated device 106.

Figure 2A:
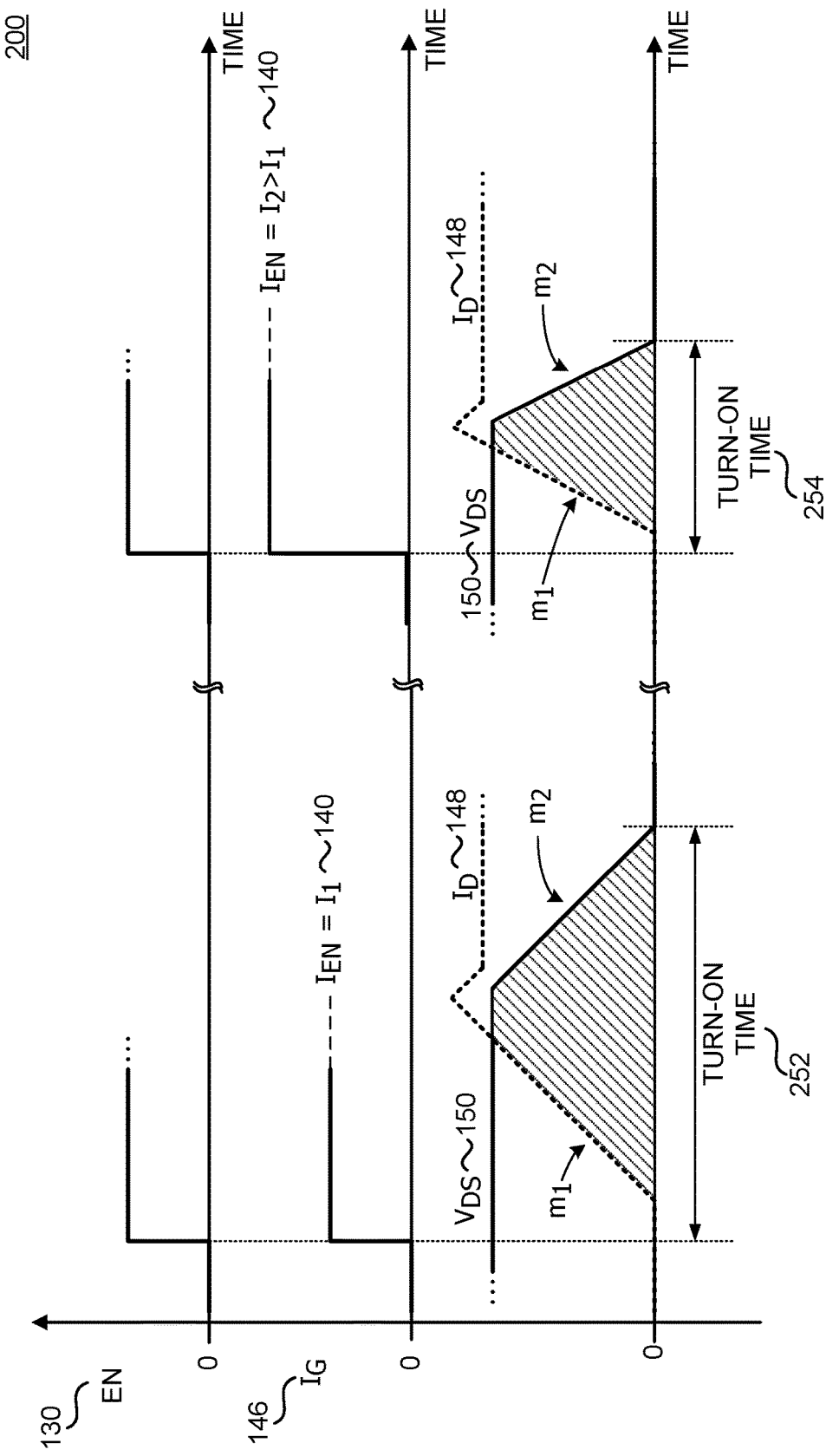
FIG. 2A is a timing diagram of various waveforms of the system of FIG. 1 during a switch turn on event, in accordance with embodiments of the present disclosure.

FIG. 2A illustrates an example timing diagram 200 of the enable signal EN 130, gate current $I_G$ 146, the drain-source voltage $V_{DS}$ 150 and drain current $I_D$ 148 during a turn-on transition of the conductivity modulated device 106 of FIG. 1. The example waveforms for the gate current $I_G$ 146, drain current $I_D$ 148, and drain-source voltage $V_{DS}$ 150 shown in FIG. 2A are straight-line approximations. Further, FIG. 2A illustrates example waveforms for the gate current $I_G$ 146, drain current $I_D$ 148, and drain-source voltage $V_{DS}$ 150 for different drive strengths. The example waveforms on the right hand side of the page illustrate providing the conductivity modulated device 106 with greater drive current than the examples waveforms on the left hand side of the page.

In the example shown, the enable signal EN 130 transitions from logic low to logic high to turn-on the switch 138 of drive element 124. Similarly, the disable signal (not shown) would transition from logic high to logic low to turn off switch 142. As such, the conductivity modulated device 106 is enabled to conduct a drain current $I_D$ 148.

Once the switch 138 is turned on (and switch 142 is turned off) by the enable signal EN 130, the gate current $I_G$ 146 increases to the magnitude of current $I_{EN}$ of current source 140. On the left hand side of the page, current $I_{EN}$ of current source 140 is substantially equal to a first current value $I_1$.

After the switch 138 is turned on, the drain current $I_D$ 148 of the conductivity modulated device 106 increases from zero with slope $m_1$. For the example shown, the drain current $I_D$ 148 increases to a peak value and then decreases to its conduction value. In the embodiment shown in FIG. 2A, the drain-source voltage $V_{DS}$ 150 of the conductivity modulated device 106 begins to decrease to zero with a slope $m_2$ once the drain current $I_D$ 148 reaches its peak value. The magnitude of slopes $m_1$ and $m_2$ are related to the magnitude of the gate current $I_G$, which for the example on the left hand side is substantially equal to the first current value $I_1$ of current source $I_{EN}$ 140. For the example shown, the turn-on time 252 begins when the enable signal EN 130 transitions to a logic high value and ends when the drain-source voltage $V_{DS}$ 150 is substantially zero and the drain current $I_D$ 148 of the conductivity modulated device 160 has reached its conduction value.

On the right hand side of the page, current $I_{EN}$ of current source 140 is substantially equal to a second current value $I_2$. As shown, the second current value $I_2$ is greater than the first current value $I_1$. The magnitudes of slopes $m_1$ (for the drain current $I_D$ 148) and $m_2$ (for the drain-source voltage $V_{DS}$ 150) are greater as compared to the magnitudes of slopes $m_1$ and $m_2$ shown on the left hand side of the page. As such, the rise time of for the drain current $I_D$ 148 is shorter (and the fall time for the drain-source voltage $V_{DS}$ 150 is shorter) resulting in an overall shorter turn-on time 254 for the operation of the conductivity modulated device 106 on the right hand side as compared to the turn-on time 252 shown on the left-hand side of the page. In other words, varying the value of the current $I_{EN}$ of the current source 140 and subsequently the gate current $I_G$ 146 of the conductivity modulated device 106 varies the turn-on time of the conductivity modulated device 106. The shaded area under the waveforms for the drain current $I_D$ 148 and the drain-source voltage $V_{DS}$ 150 represents the crossover energy loss during the turn-on of the conductivity modulated device 106. As shown the shaded area on the left hand side of the page is larger than the right hand side of the page, indicating that the crossover losses for the conductivity modulated device 106 on the left hand side of the page is greater than on the right hand side of the page. Shorter turn-on times reduce switching/crossover losses, which also reduces the amount of dissipated heat and increases the amount of power delivery by the system 100. However, shorter turn-on times may lead to increase EMI.

Figure 2B:
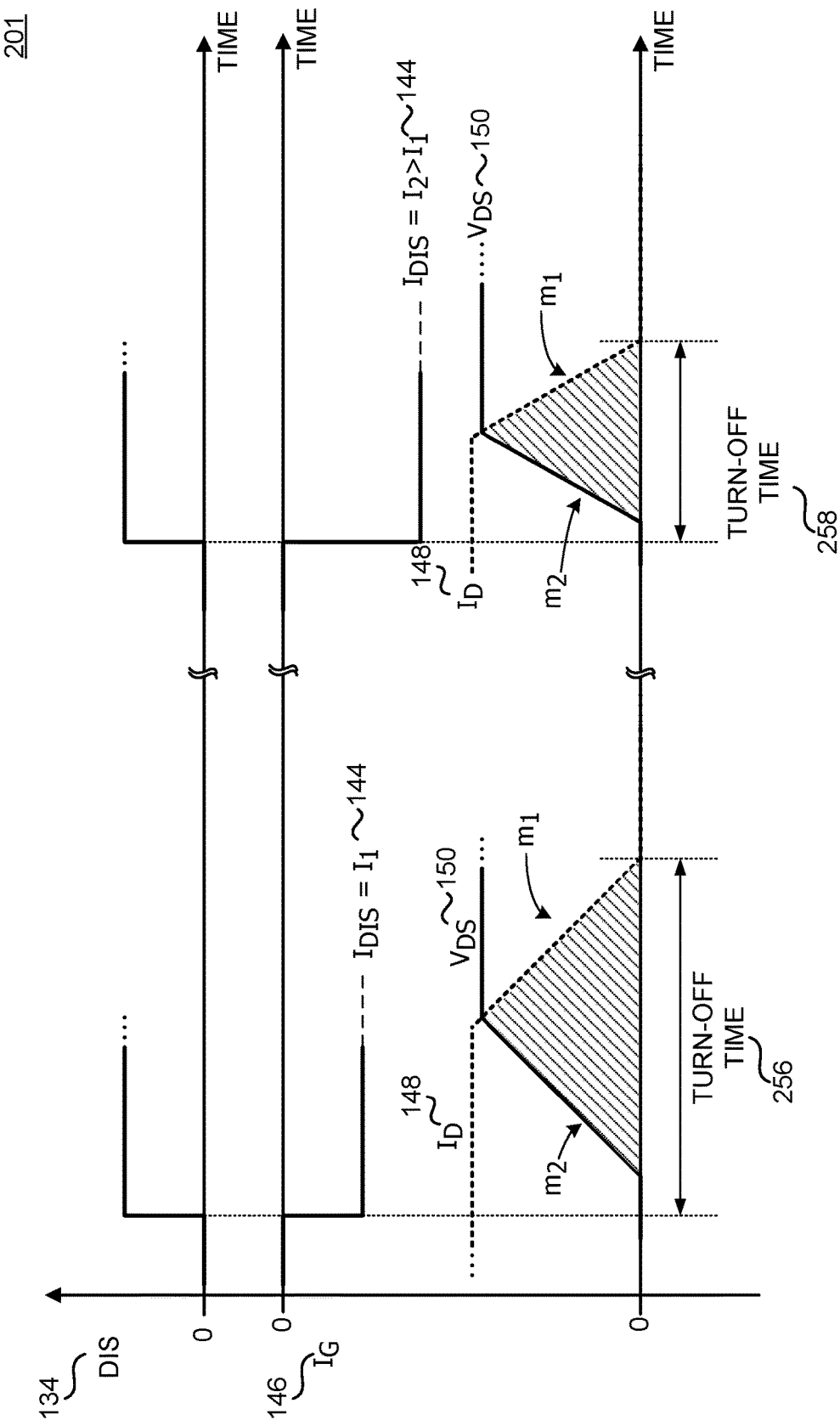
FIG. 2B is another timing diagram of various waveforms of the system of FIG. 1 during a switch turn off event, in accordance with embodiments of the present disclosure.

FIG. 2B illustrates an example timing diagram 201 of the disable signal DIS 134, gate current $I_G$ 146, the drain-source voltage $V_{DS}$ 150 and drain current $I_D$ 148 during a turn-off transition of the conductivity modulated device 106 of FIG. 1. Similar to FIG. 2A, the example waveforms for the gate current $I_G$ 146, drain current $I_D$ 148, and drain-source voltage $V_{DS}$ 150 shown are straight-line approximations. Further, FIG. 2B illustrates the example waveforms for the gate current $I_G$ 146, drain current $I_D$ 148, and drain-source voltage $V_{DS}$ 150 for different drive strengths. The example waveforms for the gate current $I_G$ 146, drain current $I_D$ 148, and drain-source voltage $V_{DS}$ 150 on the right hand side of the page has a greater drive current than the example waveforms for gate current $I_G$ 146, drain current $I_D$ 148, and drain-source voltage $V_{DS}$ 150 on the left hand side of the page.

The disable signal DIS 134 transitions from logic low to logic high to turn-on the switch 142 of drive element 126. Similarly, the enable signal (not shown) would transition from logic high to logic low to turn off switch 138. As such, the conductivity modulated device 106 is disabled from conducting a drive current $I_D$ 148.

Once the switch 142 is turned on (and switch 138 is turned off) by the disable signal DIS 134, the magnitude of the gate current $I_G$ 146 is substantially the magnitude of current $I_{DIS}$ of current source 144. For the drive element 126 shown in FIG. 1, once the switch 142 is turned on (and switch 138 is off) the gate current $I_G$ 146 is flowing to return 127. Due to the direction of current, the gate current $I_G$ 146 shown in FIG. 2B decreases. Further, the maximum magnitude of the gate current $I_G$ 146 is responsive to the magnitude of current his of current source 144. On the left hand side of the page, current his of current source 144 is substantially equal to a first current value $I_1$.

After the switch 142 is turned on, the drain-source voltage $V_{DS}$ 150 of the conductivity modulated device 106 begins to increase from zero with a slope $m_2$. For the example sown, the drain current $I_D$ 148 of the conductivity modulated device 106 decreases to zero with slope $m_1$ once the drain-source voltage $V_{DS}$ 150 has reached its peak value. The magnitude of slopes $m_1$ and $m_2$ are related to the magnitude of the gate current $I_G$, which for the example on the left hand side is substantially equal to the first current value $I_1$ of current source his 144. For the example shown, the turn-off time 256 begins when the disable signal DIS 134 transitions to a logic high value and ends when the drain current $I_D$ 148 is substantially zero and the drain-source voltage $V_{DS}$ 150 of the conductivity modulated device 160 has reached its non-conducting value.

On the right hand side of the page, current $I_{DIS}$ of current source 144 is substantially equal to a second current value $I_2$. As shown, the second current value $I_2$ is greater than the first current value $I_1$. The magnitudes of slopes $m_1$ (for the drain current $I_D$ 148) and $m_2$ (for the drain-source voltage $V_{DS}$ 150) are greater as compared to the magnitudes of slopes $m_1$ and $m_2$ shown on the left hand side of the page. As such, the fall time of for the drain current $I_D$ 148 is shorter (and the rise time for the drain-source voltage $V_{DS}$ 150 is shorter) resulting in an overall shorter turn-off time 258 for the operation of the conductivity modulated device 106 on the right hand side as compared to the turn-off time 256 shown on the left-hand side of the page. In other words, varying the value of the current his of the current source 144 and subsequently of the gate current $I_G$ 146 of the conductivity modulated device 106, the turn-off time of the conductivity modulated device 106 is shortened. The shaded area under the waveforms for the drain current $I_D$ 148 and the drain-source voltage $V_{DS}$ 150 represents the crossover loss during the turn-on of the conductivity modulated device 106. As shown the shaded area on the left hand side of the page is larger than the right hand side of the page, indicating that the crossover losses for the conductivity modulated device 106 on the left hand side of the page is greater than on the right hand side of the page. Shorter turn-off times reduce switching/crossover losses, which also reduces the amount of dissipated heat and increases the amount of power delivery by the system 100.

Figure 3:
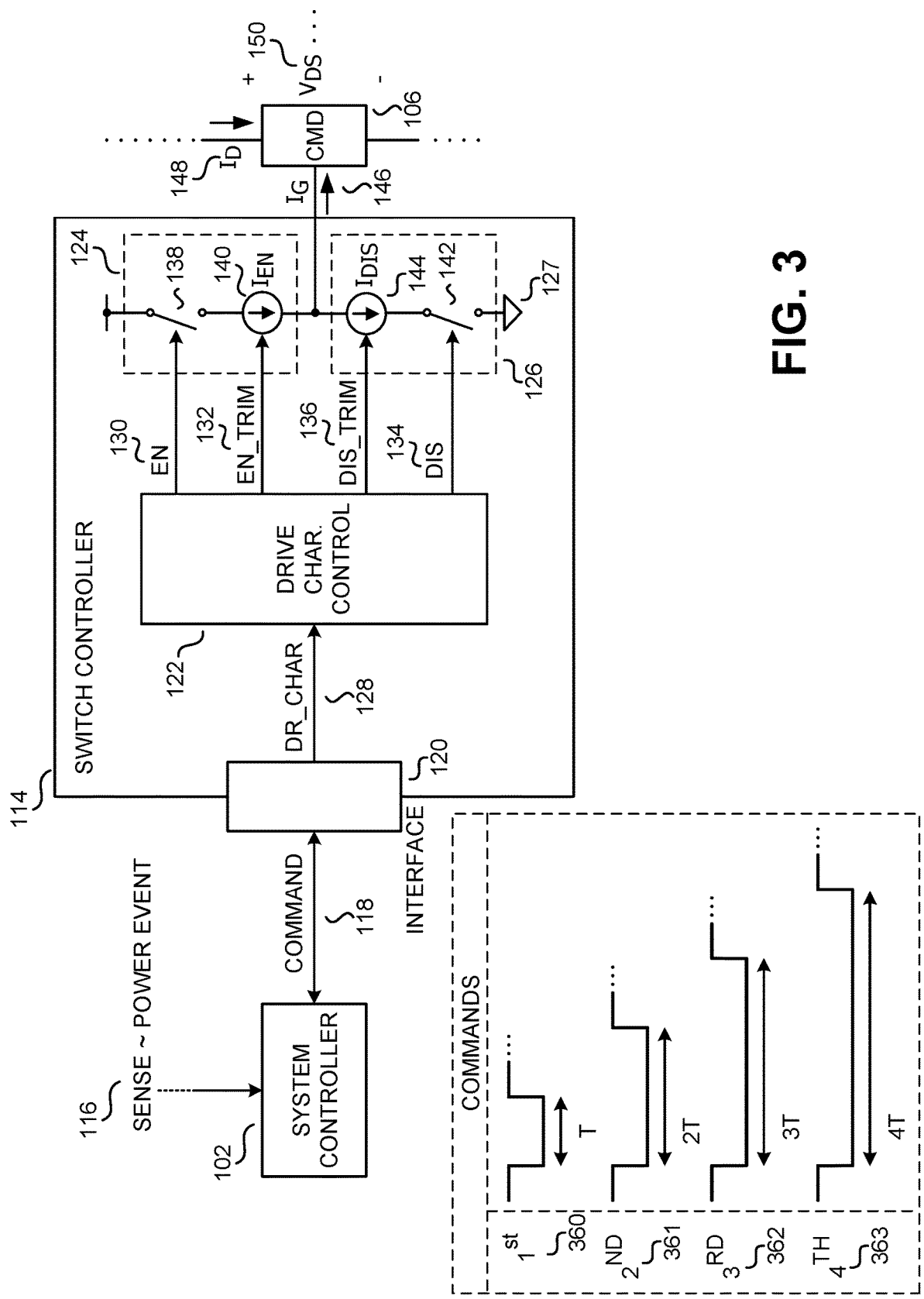
FIG. 3 is a functional block diagram of the system controller and switch controller of FIG. 1 illustrating example commands from the system controller to adjust the switch, in accordance with embodiments of the present disclosure.

FIG. 3 is a functional block diagram of the system controller 102 and switch controller 114 of FIG. 1 illustrating example command signals 118 from the system controller for different commands to adjust the conductivity modulated device 106 and/or the switch controller 114. It should be appreciated that the system controller 102, switch controller 114 and their respective elements couple and function as described above.

As shown, the command signal 118 is a rectangular pulse waveform with high and low sections. As will be discussed, the duration of the low sections corresponds with which command is being transmitted by the system controller 102, referred to as active low pulse duration encoding. Under default conditions or steady state conditions, when no command is being sent, the command signal 118 is substantially equal to the high value. In one example, the high value could be substantially 5 volts (V). When the system controller 102 sends a command to the switch controller 114 via the command signal 118, the command signal transitions to a low value. In one example, the low value could be substantially 0V. The duration of the low value section of the command signal 118 corresponds to which command is being sent by the system controller 102. The example command signal 118 in FIG. 3 is an "active low" signal in which the duration of the low section corresponds to which command is being transmitted. However, it should be appreciated that the command signal 118 may be an "active high" signal in which the duration of the high section corresponds to which command is being transmitted.

For example, a first command 360 corresponds to the command signal 118 being substantially the low value for a period T. For a second command 361, the command signal 118 could be substantially the low value for a period 2T. In the example shown, the low section of the second command 361 is twice as long as the low section for the first command 360. Similarly for the third command 362 and the fourth command 363. The command signal 118 could be substantially the low value for a period 3T for the third command 362, which is three times as long as the low section of the first command 360. For the fourth command 363, the command signal 118 could be substantially the low value for a period 4T, which is four times as long as the low section of the first command 360. In other words, the duration of each command could be a period T longer than the duration of the previous command. In one example, the interface 120 could include a timer or counter to measure the durations of the low value sections in the command signal 118 to determine which command has been received.

Example commands could include: status inquiry, reset, increase drive current, and decrease drive current. The increase drive current and decrease drive current commands are adjustment commands/signals to adjust the drive characteristics of the conductivity modulated device 106. For the first command 360, the system controller 102 could send a "status inquiry" command in which the system controller 102 pings the switch controller 114 for the "status" of the switch controller 114, such as the information stored in a status register of the switch controller For the second command 361, the system controller 102 could send a "reset" command in which the system controller 102 allows the switch controller 114 to be restarted or turned on.

For the third command 362, the system controller 102 could send an adjustment command to "increase drive current" in which the system controller 102 indicates that the switch controller 114 should increase either the current $I_{EN}$ of current source 140 or current his of current source 144, or both, to decrease the rise time of the drain current $I_D$ 148 or the fall time of the drain current $I_D$ 148, or both (i.e. the fall time of the drain-source voltage $V_{DS}$ 150 or the rise time of the drain-source voltage $V_{DS}$ 150, or both). The decreased rise time or fall time would shorten the turn-on time or turn-off time, respectively, of the conductivity modulated device 106. Under normal operating conditions, the drive characteristic control 122 outputs the enable trim signal 132 and the disable trim signal 136 such that the current $I_{EN}$ of current source 140 and current $I_{DIS}$ of current source 144 are substantially equal to the first current value $I_1$ (of FIGS. 2A and 2B). In one example, the system controller 102 outputs the third command 362 in response to the sense signal 115 indicating that there is a power event in the system 100 in which the system controller 102 may want to deliver more power. In response to the third command 362, the drive characteristic controller 122 could output either the enable trim signal 132 or the disable trim signal (or both) to adjust the value of current $I_{EN}$ of current source 140 or current $I_{DIS}$ of current source 144 (or both) to the second current value $I_2$ (as shown in FIGS. 2A and 2B) and increasing the drive current of the conductivity modulated device 106.

For the fourth command 363, the system controller 102 could send an adjustment command to "decrease drive current" (or in other words a "return drive current" command) in which the system controller 102 indicates that the switch controller 114 should decrease (or return) either the current $I_{EN}$ of current source 140 or current $I_{DIS}$ of current source 144, or both, to increase the rise time of the drain current $I_D$ 148 or the fall time of the drain current $I_D$ 148, or both (i.e. increase the fall time of the drain-source voltage $V_{DS}$ 150 of the rise time of the drain-source voltage $V_{DS}$ 150, or both). Or in other words, the system controller 102 indicates that the switch controller 114 should return the value of current $I_{EN}$ of current source 140 or current his of current source 144, or both, to the first current value $I_1$ of FIGS. 2A and 2B. In one example, the sense signal 115 indicates to the system controller 102 that the increased power event in the system 100 has passed. In response to the fourth command 363, the drive characteristic controller 122 could output either the enable trim signal 132 or the disable trim signal (or both) to adjust the value of current $I_{EN}$ of current source 140 or current his of current source 144 (or both) to the first current value $I_1$ of FIGS. 2A and 2B and decreases (or returns) the drive current of the conductivity modulated device 106 to its default current value. Although for this example, the commands: status inquiry, reset, increase drive current, and decrease drive current are the first, second, third, and fourth commands 360, 361, 362, and 363, respectively, it should be appreciated that the commands could be in any order.

In some embodiments, the communication between the system controller 102 and the switch controller 114 may be bidirectional. For example, the switch controller 114 may sense a fault condition (such as overcurrent, overvoltage, overheating, etc) in the system 100 and communicates the fault to the system controller 102. The fault communication from the switch controller 114 may be encoded as a multi-bit word to the system controller 102.

Figure 4:
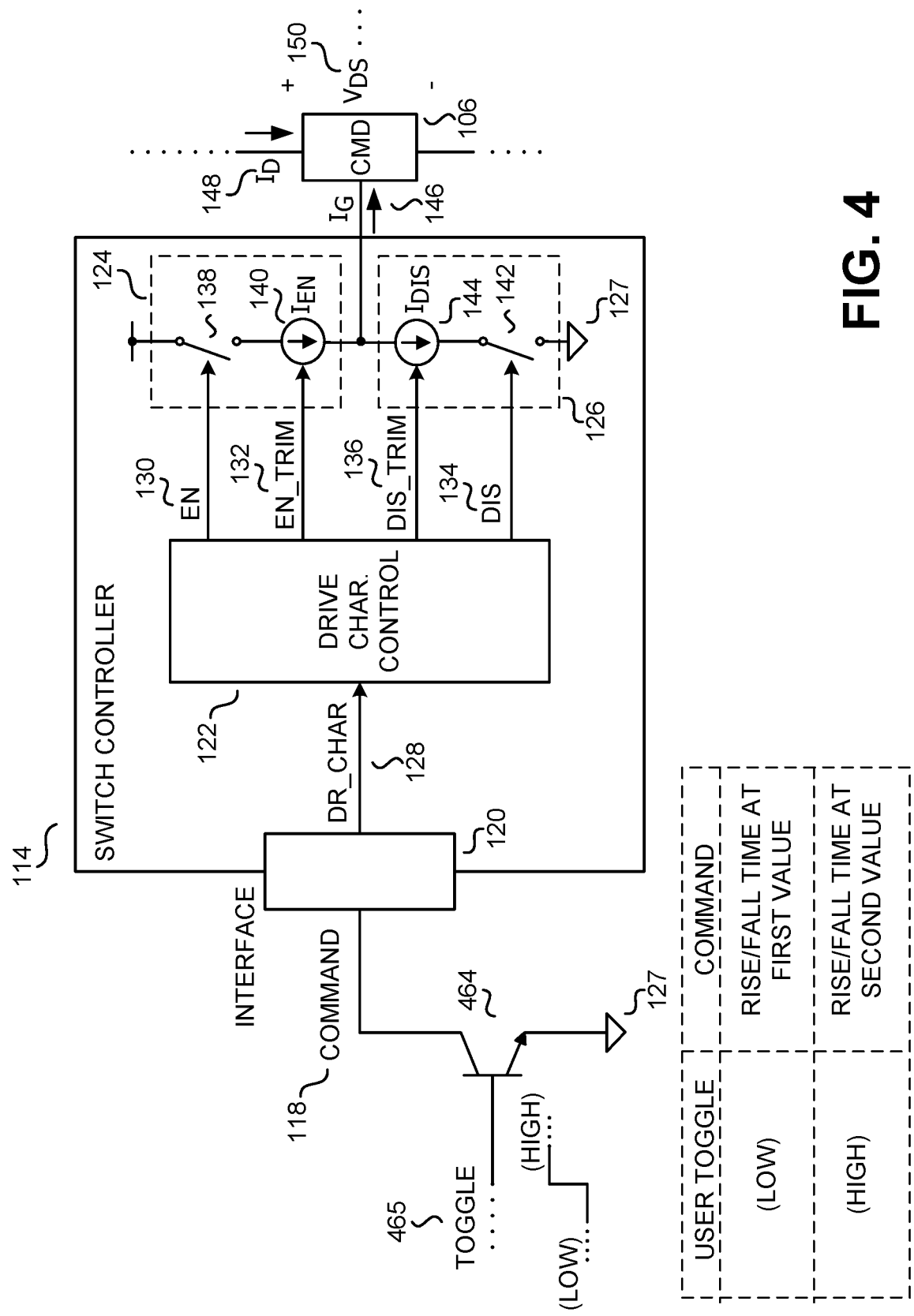
FIG. 4 is a functional block diagram of a switch controller illustrating receiving commands from a user, in accordance with embodiments of the present disclosure.

FIG. 4 illustrates the switch controller 114 receiving the command signal 118 in response to a toggle 465, in accordance with embodiments of the present disclosure. In one embodiment, the toggle 465 could be in response to a user. In another embodiment, the toggle 465 could be in response to a dedicated hardware sensor which senses the power event. It should be appreciated that the switch controller 114 and its elements couple and function as described above. In one example, the switch controller 114 may receive commands from both the system controller (not shown) and the toggle 465. In another example, the switch controller 114 receives the command signal 118 in response to just the toggle 465.

The toggle 465 may be a rectangular pulse waveform of logic high and logic low sections. In one embodiment, the toggle 465 is representative of a user manually selecting from two choices, such as a mechanical switch. A logic low value for the toggle 465 corresponds to the rise time/fall time of the drain current $I_D$ 148 (rise time/fall time of the drain-source voltage $V_{DS}$ 150) substantially equal to a first value, as for example, the gate current $I_G$ 146 substantially equal to the first current value $I_1$ as shown in FIGS. 2A and 2B. A logic high value for the toggle 465 could correspond to the rise/fall time of the drain current $I_D$ 148 (rise time/fall time of the drain-source voltage $V_{DS}$ 150) substantially equal to a second value, as for example, the gate current $I_G$ 146 substantially equal to the second current value $I_2$ as shown in FIGS. 2A and 2B.

As shown in one embodiment, a transistor 464 is coupled to the interface 120 of the switch controller 114 and the return 127. The control terminal of the transistor 464 is configured to receive the toggle 465. In the embodiment shown, the transistor 464 is a bipolar junction transistor (BJT). The base of the transistor 464 is configured to receive the toggle 465, the emitter of transistor 464 is coupled to the return 127 and the collector of the transistor 464 is coupled to the interface 120. For the embodiment shown, the command signal 118 is a voltage signal and is the collector voltage or the collector-emitter voltage of transistor 464. In operation, when the toggle 465 is low, the transistor 464 is off and the command signal 118 is high. As such, a high value for the command signal 118 corresponds to the rise time/fall time of the drain current $I_D$ 148 (rise time/fall time of the drain-source voltage $V_{DS}$ 150) substantially equal to the first value. When the toggle 465 is high, the transistor 464 is on and the command signal 118 is substantially equal to the return 127 (i.e. low value). As such, a low value for the command signal 118 corresponds to the rise time/fall time of the drain current $I_D$ 148 (rise time/fall time of the drain-source voltage $V_{DS}$ 150) substantially equal to the second value.

Figure 5A:
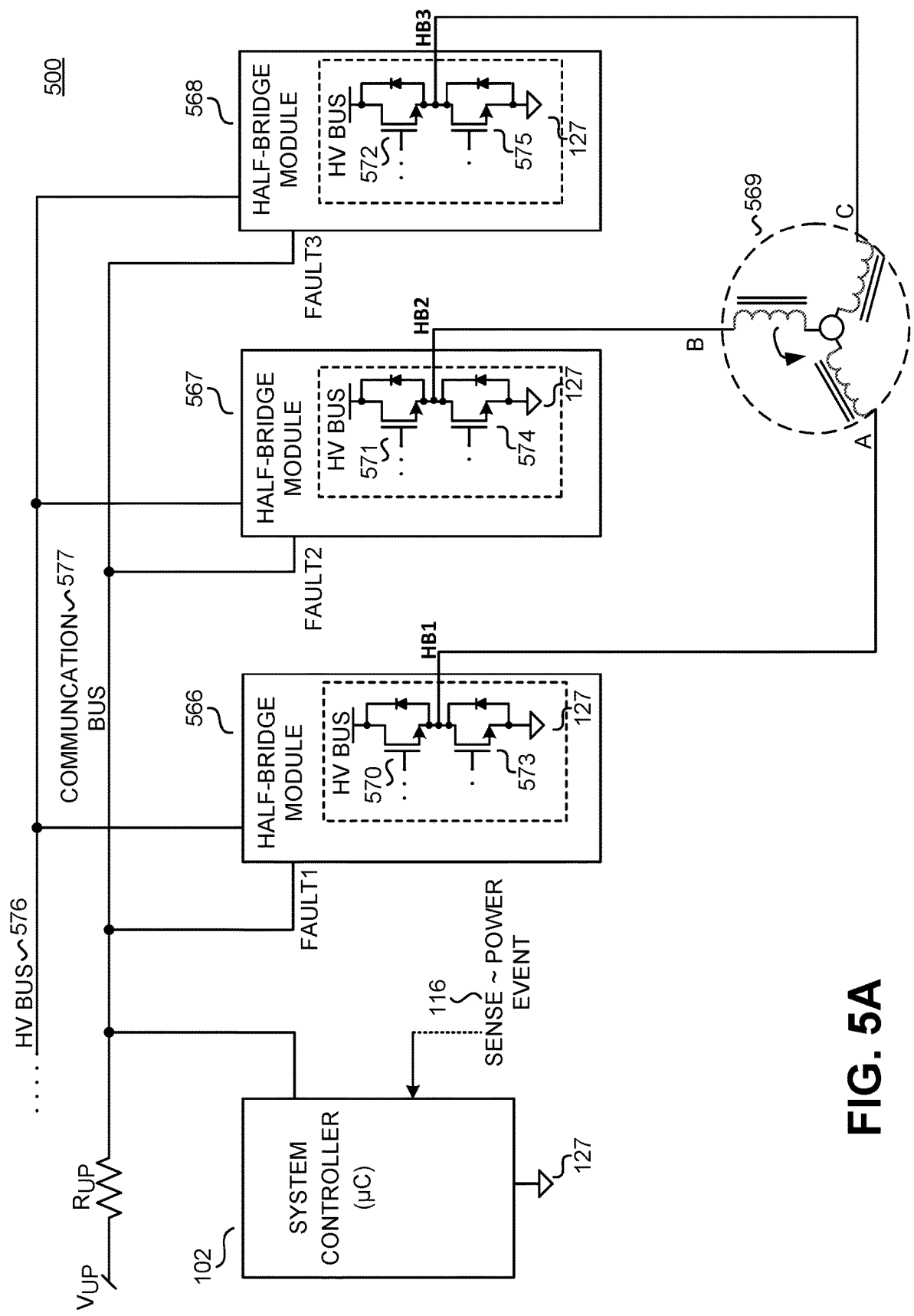
FIG. 5A is a functional block diagram of a motor driver with a system controller to adjust one or more switches of various half-bridge modules, in accordance with embodiments of the present disclosure.

FIG. 5A illustrates a multi-phase motor drive system 500 including three half-bridge inverter modules 566, 567, and 568, coupled individually to a high-voltage (HV) bus 576 and controlled with a single system controller 102 to drive a motor 569, such as for example a single-phase or 3-phase motor. As shown, each half-bridge inverter modules 566, 567, and 568 and the system controller 102 are referenced to return 127. Further, the system controller 102 can adjust the drive characteristics of one or more switches of the various half-bridge inverter modules 566, 567, and 568, in accordance with the teachings of the present disclosure. As shown, each switch is represented by an n-type metal-oxide-semiconductor field effect transistor (MOSFET) and is a conductivity modulated device as discussed above.

Each half-bridge module 566, 567, 568 are individually coupled to the HV bus 576. Each half-bridge module 566, 567, 568, includes a high side switch 570, 571, 572, and a low side switch 573, 574, 575, respectively coupled together as a power converter or an inverter in a full-bridge configuration. Each switch 570, 571, 572, 573, 574, and 575 is controlled by its own switch controller (shown further in FIG. 5B) and form a power switching array. The half-bridge mid-point terminals HB1, HB2, HB3 between each high side and low side switch of their respective half-bridge modules 566, 567, 568, are coupled to the three phase terminals A, B, and C of the multiphase motor 569. In one example, the motor 569 is a brushless 3-phase DC motor, which may be included in for example an electric appliance, power tool, fan, or the like. In operation, the half-bridge modules 566, 567, and 568 provides the input electrical signals (such as voltage, current, frequency, and phase for the desired mechanical output load motion) to the motor 569 from the electrical energy supplied by the HV bus 576. The switching properties of switches 570, 570, 571, 572, 573, 574, and 575 are controlled by their respective switch controllers to regulate the energy flow to the motor 569. In other words, the switch controllers adjust the output to the motor 569 to maintain the target operation of the motor 569.

The system controller 102 couples to each half-bridge module 566, 567, and 568 through the communication bus 577. Similar to above, in embodiments the system controller 102 receives a sense signal 116 representative of a power event. In one embodiment, the power event may be an indication to the system controller 102 to adjust one or more drive characteristics of one or more of switches 570, 570, 571, 572, 573, 574, and 575. For embodiments, the system controller adjusts the drive current of one or more of switches 570, 570, 571, 572, 573, 574, and 575 in response to the sensed power event 116. Or in other words, the power event may indicate to the system controller 102 to decrease switch turn-on time and/or turn-off time by increasing the magnitude of the gate current $I_G$ 146 of one or more of switches 570, 570, 571, 572, 573, 574, and 575 to increase the rise time and/or fall time of the drain current $I_D$ 148 of one or more of switches 570, 570, 571, 572, 573, 574, and 575. One example of a sensed power event which would increase the magnitude of the gate current $I_G$ 146 could include an outdoor air conditioning fan during startup that may have to overcome possible wind blowing conditions. Another example of a sensed power event could include a dishwasher water pump which has to pump a large amount of water in case the drain for the dishwasher has unexpectedly flooded. A further example of a sensed power event could include a refrigerator during initial installation to cool itself to the desired temperature.

The system controller 102 is configured to output a command signal to one or more half-bridge modules 566, 567, and 568. In one embodiment, the system controller 102 can send the command signal via the communication bus 577. In another embodiment, the system controller 102 sends the command signal via a separate connection. The command signal 118 could be a voltage signal or a current signal. In one example, the command signal 118 could be representative of a digital word. Further, the system controller 102 could apply coding to the command signal 118. As will be further illustrated with respect to FIG. 5B, the system controller 102 outputs a command signal 118 to at least one switch controller of one or more half-bridge modules 566, 567, and 568 via the communication bus 577. In one embodiment, the command signal is outputted in response to the received sense signal 116 and may be representative of commands by the system controller 102 for the respective switch controller. Example commands communicated by the system controller 102 could include a "status inquiry" command for one or more of the half-bridge modules 566, 567, and 568. Another example command communicated by the system controller 102 could include a "fault" command in which the system controller 102 has sensed a fault condition (such as overcurrent, overvoltage, overheating, etc) in the system 100 and communicates the fault to half-bridge modules 566, 567, and 568. In general, the half-bridge modules 566, 567, and 568 respond to the fault command by turning off their respective high-side and low-side switches.

In embodiments of the present disclosure, the system controller 102 communicates a command signal 118, representative of the drive characteristics of one or more of the high-side switches 570, 571, 572 and low-side switches 573, 574, and 575. An example drive characteristic includes the magnitude of the gate current $I_G$ 146 for the respective switch, which is related to the rise time and/or fall time of the drain current $I_D$ 148 and drain-to-source voltage 150 for the respective switch. Another example drive characteristic could include the duration which one or more of switches 570, 571, 572 573, 574, and 575 is driven by the gate current $I_G$ 146. For example, the command communicated via the communication bus 577 could be representative of driving one or more of switches 570, 571, 572 573, 574, and 575 at a first magnitude of gate current $I_G$ or a second magnitude of gate current $I_G$, where the second magnitude is greater than the first magnitude. Although it should be appreciated that the command signal 118 could represent driving one or more of switches 570, 571, 572 573, 574, and 575 with more than two magnitudes of gate current $I_G$.

Half-bridge modules 566, 567, and 568 are coupled to a communication bus 577, which is also coupled to system controller 102. The communication bus 577, which in one example is an open collector configuration, is coupled to a supply voltage $V_{UP}$ through a pull up resistor $R_{UP}$. Further, the communication bus 577 may be in one example, a single-wire communication bus. As mentioned above, the communication bus 577 may be utilized by the system controller 102 to communicate commands to one or more half-bridge modules 566, 567, and 568. In one example, the communication bus 577 in normal steady state condition is pulled up to supply voltage $V_{UP}$, and during any communication can be pulled down by the system controller 102 for sending a command to half-bridge modules 566, 567, and 568. In one embodiment, the communication bus 577 can be pulled down for a detection of a command through a digital multi-bit word. In another embodiment, the communication bus 577 can be pulled down to communicate a command as discussed with respect to FIG. 3. In some embodiments, the duration which the communication bus 577 is pulled down corresponds with the command sent by the system controller 102.

Figure 5B:
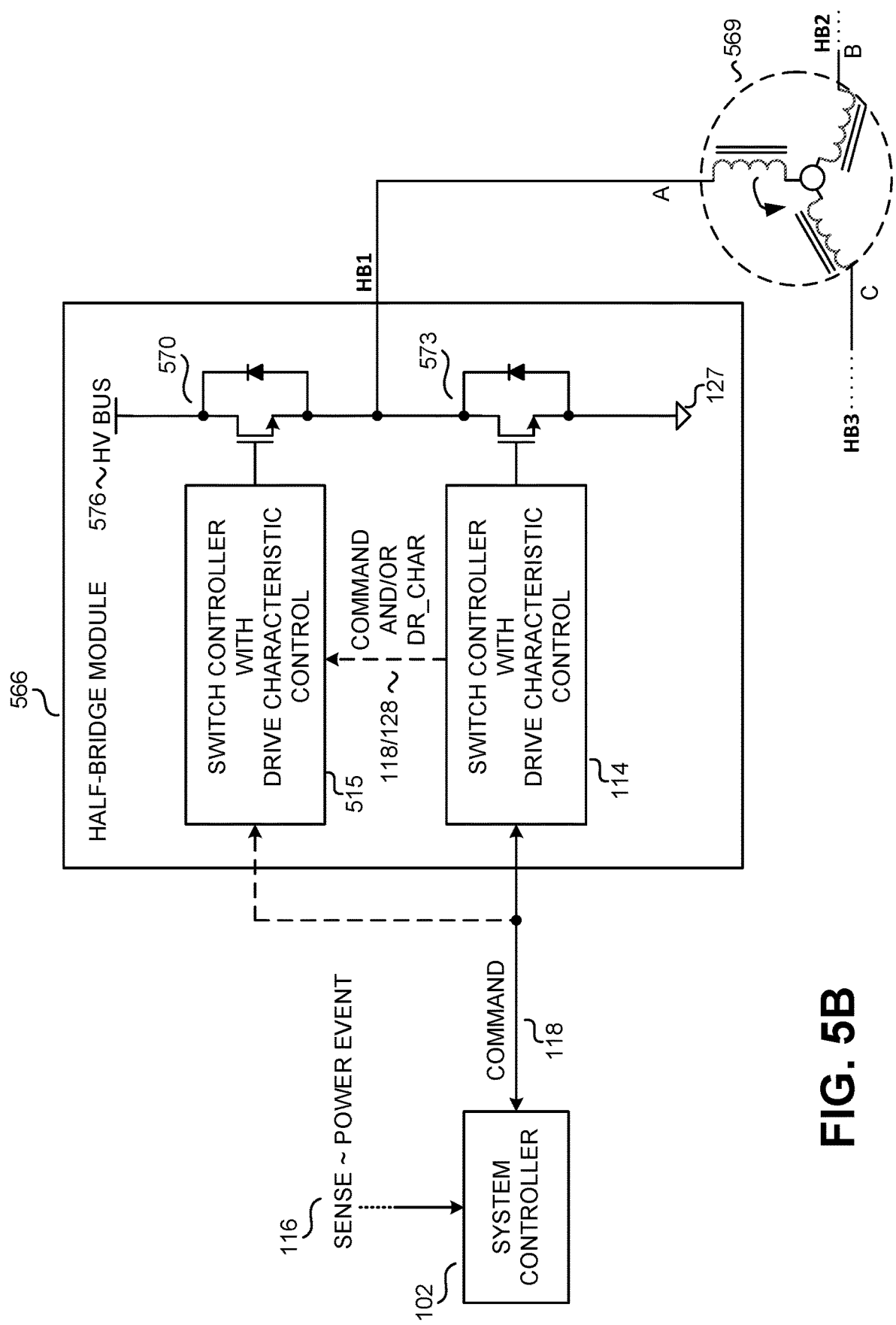
FIG. 5B is a functional block diagram of the system controller and half-bridge module of FIG. 5A, in accordance with embodiments of the present disclosure.

FIG. 5B provides increased detail of the half-bridge modules in accordance with embodiments of the present disclosure. Specifically, FIG. 5B illustrates the half-bridge module 566, but it should be appreciated that the other half-bridge modules 567, 568, although present, are not shown in detail. Further the elements included in half-bridge modules 567, 568 are similar to what is shown in FIG. 5B with regards to half-bridge module 566.

Half-bridge module 566 includes high-side switch 570 and low-side switch 537 coupled together in series. The high-side switch 570 and low-side switch 537 are exemplified by n-type MOSFETs with their respective body diodes. The drain of the high-side switch 570 is coupled to the HV bus 576 and the source of the source of low-side switch 573 is coupled to return 127. The half-bridge mid-point HB1 is coupled to phase A of motor 569.

Half-bridge module 566 further includes switch controllers 114 and 515. Switch controller 114 is coupled to control the low-side switch 573 while switch controller 515 is coupled to control the high-side switch 570. Both switch controllers 114, 515 include drive characteristic control for their respective switches, as discussed above and in accordance with embodiments of the present disclosure. The switch controllers 114 and 515 can also include interfaces to receive the command signal 118, as will be further discussed. Similar to above, switch controllers 114, 515 control the enabling and disabling, along with the turn-on time and turn-off time of their respective switches. Further, the switch controllers 114, 515 can adjust the drive characteristics of the low-side switch 573 and the high-side switch 570, respectively, in response to the system controller 102.

The system controller 102 is coupled to half-bridge module 566 and switch controller 114. As shown, the system controller 102 outputs the command signal 118 to the switch controller 114. In response to the command signal 118 received from the system controller 102, the switch controller 114 adjusts the drive characteristics of the low-side switch 537. In one embodiment, the interface (not shown) of the switch controller 114 receives the command signal 118 and outputs the drive characteristic signal to the drive characteristic control of switch controller 114. The drive characteristic control then outputs signals to the drive elements which enable and disable the low-side switch 573. The system controller 102 may send the command signal 118 via the communication bus 577 or by another coupling to switch controller 114.

As shown in a dashed line, in some embodiments the system controller 102 can optionally be coupled to switch controller 515 to provide the command signal 118 rather than providing the command signal 118 via the switch controller 114. In response to the command signal 118, the switch controller 515 adjusts the drive characteristics of the high-side switch 570. In one embodiment, the interface (not shown) of the switch controller 515 receives the command signal 118 and outputs the drive characteristic signal to the drive characteristic control of switch controller 515. The drive characteristic control then outputs signals to the drive elements which enable and disable the high-side switch 570. The system controller 102 may send the command signal 118 by another coupling to switch controller 515 or via the communication bus 577.

In another alternative embodiment shown by the dashed line, switch controller 114 couples to switch controller 515. The switch controller 114 sends either the received command signal 118 or the drive characteristic signal 128 to switch controller 515 rather than the switch controller 515 receiving the command signal 118 from the system controller 102. Communication from the low-side switch controller 114 to the high-side switch controller 515 may be accomplished through communication links between the low-side switch controller 114 and the high-side controller 515. For example, the control signals for controlling both the high-side switch 570 and low-side switch 573 may be received by the low-side switch controller 114 from the system controller 102. The control signal for switching the high-side switch 570 may be communicated to the high-side controller 515 from the low-side switch controller 114 via communication links.

In one embodiment, the low-side switch controller 114 relays the command signal 118 received from the system controller 102 to adjust the drive characteristics of the high side switch 570, such as the high-side drive current, to the high-side switch controller 515. For this example, the high-side switch controller 515 includes the interface (not shown) to receive the command signal 118 from the low-side switch controller 114 and outputs the drive characteristic signal to the drive characteristic control of switch controller 515. The drive characteristic control then outputs signals to drive elements which enable and disable the high-side switch 570.

In another embodiment, the low-side switch controller 114 receives the command signal 118 to adjust the drive characteristics of the high side switch 570, such as the high-side drive current, at an interface (not shown). The interface (not shown) outputs the drive characteristic signal 128 to adjust the drive characteristics of the high side switch 570 and the drive characteristic signal 128 of the low-side switch controller 114 is communicated to the high-side switch controller 515. For this example, the high-side switch controller 515 includes its own drive characteristic control which is coupled to and receives the drive characteristic signal 128 of the low-side switch controller 114. The drive characteristic control of switch controller 515 then outputs signals to drive elements which enable and disable the high-side switch 570.

Figure 6A:
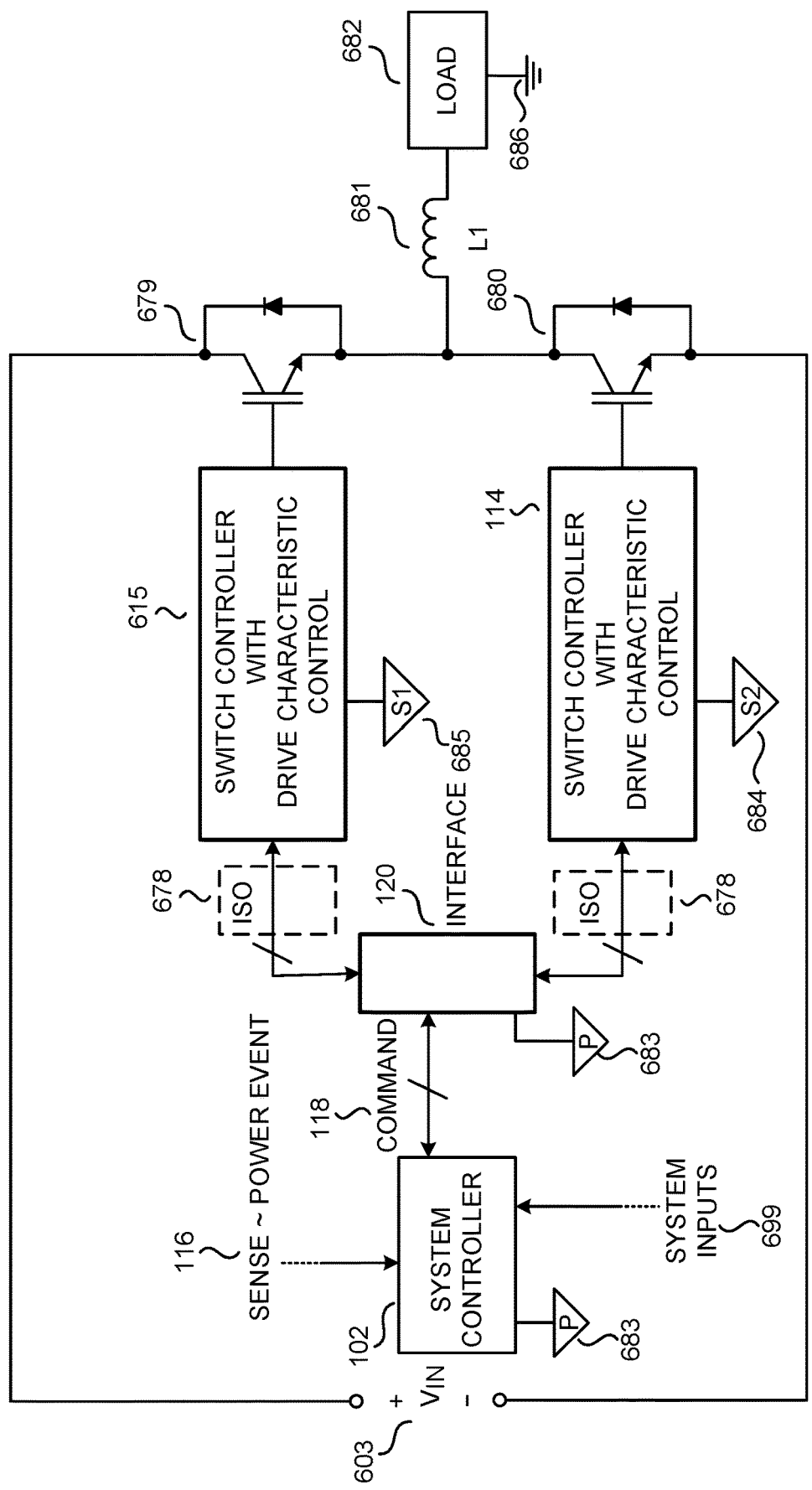
FIG. 6A is a functional block diagram of one example of a power converter in a half-bridge configuration with a system controller to adjust one or more switches, in accordance with embodiments of the present disclosure.

FIG. 6A illustrates an example power converter 600 with switch controllers 114, 615 which include drive characteristic control in accordance with embodiments of the present disclosure. Switch controllers 114, 615 include drive characteristic control which is responsive to the system controller 102. Further, the system controller 102 can adjust the drive characteristics of switches 679, 680, in accordance with embodiments of the present disclosure. Power converter 600 receives an input voltage VIN 602 and is designed to transfer electrical energy form an input to a load 682 through an energy transfer element L1 681 by controlling the switching of power switches 679, 680. In various implementations, the power converter 600 can control the voltage, current, or power levels of the energy output to the load 682. In the example shown in FIG. 6A, the energy transfer element L1 681 and two power switches 679, 680 are coupled together in a half-bridge configuration, however other topologies can be used. The power switches 679, 680 form a power switching array. Switch controller 114 may be referred to as a low-side switch controller while switch controller 615 may be referred to as a high-side switch controller.

In the example shown, power switches 679, 680 are IGBTs. However, examples of the present invention can also be used in combination with other power switch technologies. For example, metal-oxide-semiconductor field-effect transistors (MOSFETs), bipolar transistors, injection enhancement gate transistors (IEGTs) and gate turn-off thyristors (GTOs) can be used. In addition, power converter 600 can be used with power switches which are based on gallium nitride (GaN) semiconductors or silicon carbide (SiC) semiconductors.

System controller 102 is coupled to receive system inputs 699, sense signal 116 and provides the command signal 118. The system controller 102 determines whether the switch controllers 114, 615 should turn on or turn off the power switches 679, 680 based on system inputs 699. Example system inputs 699 include pulse width modulated (PWM) signal for a general purpose motor drive, a turn-on and turn-off sequence of a multi-level power converter, or a system fault turn-off request. The sense signal 116 is also a system input and in one embodiment is representative of a power event. In one embodiment, the power event may be an indication to the system controller 102 to adjust the drive characteristic of either power switch 679, 680 or both. In one example of adjusting the drive characteristic of either power switch 679, 680, the power event may be an indication to increase the drive current of either power switch 679, 680 or both. Or in other words, the power event may indicate to the system controller 102 to decrease turn-on time and/or turn-off time by increasing the magnitude of the control current for either power switch 679, 680 or both to increase the rise time and/or fall time of the current conducted by either power switch 679, 680 or both.

In the illustrated example, system controller 102 outputs a command signal 118 representative of one or more commands to the interface 120 of switch controllers 114, 615. Example commands include enabling or disabling power switches 679, 680, reset, fault notification, and adjust the drive current (i.e. rise time and/or fall time of conducted current) of power switches 679, 680. The command signal 118 could be a voltage signal or a current signal. In one example, the command signal 118 could be representative of an N-bit digital word. Further, the system controller 102 could apply coding to the command signal 118. In one example, the communication between the system controller 102 and the interface 120 may be bidirectional.

Interface 120 is coupled to the system controller 102 and receives the command signal 118. FIG. 6A illustrates a single interface 120 for both the switch controllers 114, 615. However, it should be appreciated that each switch controller 114, 615 may have its own interface and as such the system controller 102 would output the command signal 118 to both interfaces. The interface 120 and the system controller 102 are both referenced to a primary reference potential 683 while the switch controller 114 is referenced to a secondary reference potential 684 and the switch controller 615 is referenced to a secondary reference potential 685. Secondary reference potentials 684, 685 are different potentials. In one example, reference potential 685 is coupled to the half-bridge point between the high-side switch 679 and the low-side switch 680 while reference potential 684 is coupled to the emitter of low-side switch 680. The switch controllers 114, 615 are galvanically isolated from the interface 120 by isolated communication links 678. The isolated communication links 678 may be implemented as an inductive coupling, such as a signal transformer or coupled inductor, optical coupling, or capacitive coupling. Further, the switch controllers 114, 615 may bidirectionally communicate with the interface 120 via the communication links 678.

Interface 120 interprets the command signal 118 sent by the system controller 102 and sends the drive characteristic signal to switch controllers 114, 615 to drive the power switches 679, 680 and further, to adjust the drive current of power switches 679, 680. The switch controllers 114, 615 receive their respective drive characteristic signals and generate drive signals to control the power switches 670, 680. As discussed above, the switch controllers 114, 615 include drive characteristic control circuits and enable and disable drive elements to control the drive current (i.e. drive strength) of power switches 680, 679. As such, the system controller 102 adjusts the drive strength of power switches 680, 679.

Figure 6B:
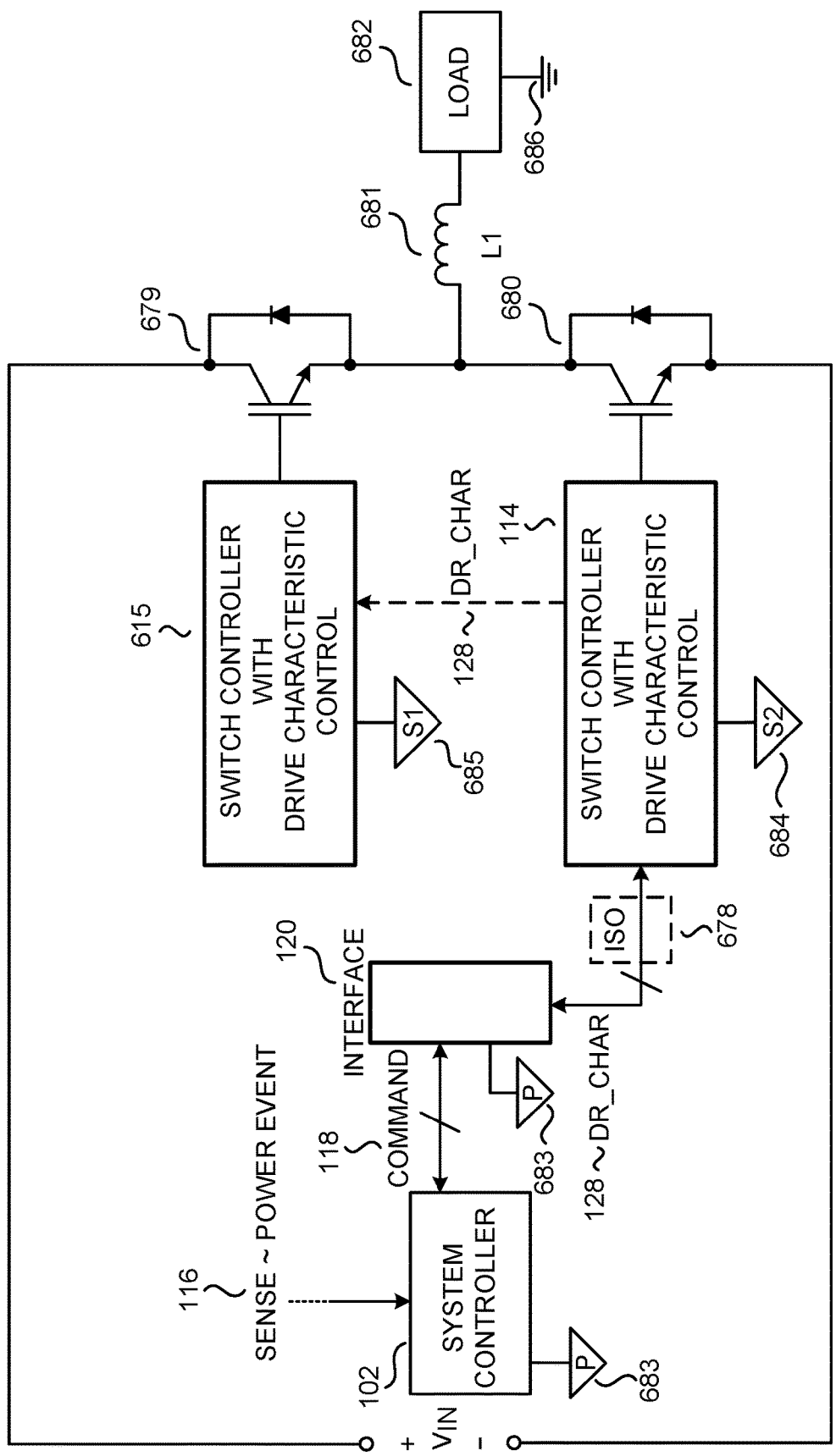
FIG. 6B is a functional block diagram of another example of a power converter in a half-bridge configuration with a system controller to adjust one or more switches, in accordance with embodiments of the present disclosure.

FIG. 6B illustrates another example of a power converter 601 in a half-bridge configuration with a system controller 102 to adjust the drive characteristics, such as for example the drive current, of power switches 679, 680. It should be appreciated that the power converter 601 shares many similarities with the power converter 600 shown in FIG. 6B. At least one difference however, is the interface 120 couples to switch controller 114 through isolation interface 678 and does not couple to the switch controller 615. For the example shown in FIG. 6B, interface 120 interprets the command signal 118 and outputs the drive characteristic signal 128 to the switch controller 114. The switch controller 114 sends the drive characteristic signal 128 to switch controller 615 rather than the switch controller 815 receiving the drive characteristic signal from interface 120. Communication from the low-side switch controller 114 to the high-side switch controller 615 may be accomplished through communication links between the low-side switch controller 114 and the high-side controller 615. For this example, the high-side switch controller 615 includes its own drive characteristic control which is coupled to and receives the drive characteristic signal 128 of the low-side switch controller 114. The drive characteristic control of switch controller 615 then outputs signals to drive elements which enable and disable the high-side switch 679.

Figure 6C:
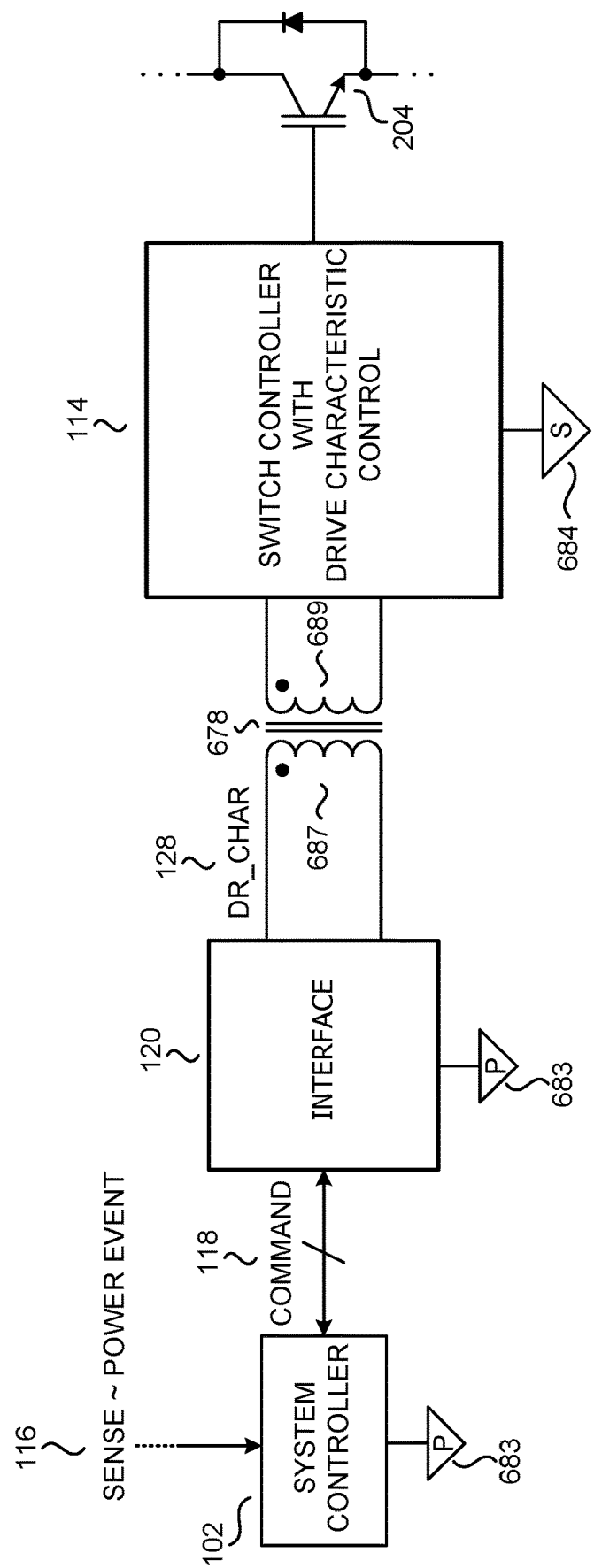
FIG. 6C is a functional block diagram of the system controller, interface, and switch controller of FIGS. 6A and 6B, in accordance with embodiments of the present disclosure.

FIG. 6C illustrates an example isolated communication link 678. For simplicity, only the isolated communication link 678 between interface 120 and switch controller 114 is shown. The interface 120 and the system controller 102 are both referenced to a primary reference potential 683 while the switch controller 114 is referenced to a secondary reference potential 684. The switch controller 114 is galvanically isolated from the interface 120 by isolated communication links 678. The isolated communication links 678 illustrated is a signal transformer with a primary winding 687 and a secondary winding 689. The interface 120 is coupled to the primary winding 687 and outputs the drive characteristic signal 128. The switch controller 114 is coupled to the secondary winding 689 and receives the drive characteristic signal 128 multiplied by the turns ratio of the primary and secondary windings 687, 689.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

Although the present invention is defined in the claims, it should be understood that the present invention can alternatively be defined in accordance with the following examples:

Example 1. A control system configured to control a conductivity modulated device of a power switching array that is configured to control energy delivery to a load, comprising a system controller configured to sense a power event in the control system and to output a command signal to adjust a drive characteristic of the conductivity modulated device in response to the sensed power event; and a switch controller coupled to the system controller and configured to receive the command signal, the switch controller further configured to control energy delivery to the load by controlling the turn on and turn off of the conductivity modulated device, wherein the switch controller comprises an adjustable drive element configured to control a rise time and/or a fall time of a voltage across the conductivity modulated device; and a drive characteristic control configured to receive the command signal and vary the drive characteristic of the conductivity modulated device, the drive characteristic control further configured to vary the adjustable drive element to adjust the rise time and/or the fall time of the voltage across the conductivity modulated device in response to the command signal generated by the system controller.

Example 2. The control system of example 1, the drive characteristic control configured to adjust a rise time and/or a fall time of a current conducted by the conductivity modulated device.

Example 3. The control system of examples 1 or 2, wherein the adjustable drive element comprises a switch coupled to the drive characteristic control, the switch configured to be turned on or off to enable or disable the conduction of current by the conductivity modulated device; and a trimmable current source coupled to the drive characteristic control and coupled in series with the switch, the drive characteristic control being further configured to control a current provided by the trimmable current source in response to the command signal to vary the rise time and/or the fall time of the voltage across the conductivity modulated device.

Example 4. The control system of any one of examples 1 to 3, the drive characteristic control further configured to control the current provided by the trimmable current source to vary a rise time and/or a fall time of the current conducted by the conductivity modulated device.

Example 5. The control system of any one of examples 1 to 4, wherein the drive characteristic control is further configured to control a magnitude of the current provided by the trimmable current source.

Example 6. The control system of any one of examples 1 to 5, wherein the drive characteristic control is further configured to control a duration of the current provided by the trimmable current source.

Example 7. The control system of any one of examples 1 to 6, wherein the drive characteristic control is further configured to control a frequency of the current provided by the trimmable current source.

Example 8. The control system of any one of examples 1 to 7, wherein the switch controller further comprises an interface coupled to the system controller and configured to receive a command signal, the interface further configured to interpret the command signal and output a drive characteristic signal to the drive characteristic control to adjust the rise time and/or fall time of conductivity modulated device.

Example 9. The control system of any one of examples 1 to 8, wherein the interface is galvanically isolated from the drive characteristic control.

Example 10. The control system of any one of examples 1 to 9, wherein the control system controls energy delivery to a motor.

Example 11. The control system of any one of examples 1 to 10, wherein the conductivity modulated device is a transistor.

Example 12. The control system of any one of examples 1 to 11, wherein the command signal is a rectangular pulse waveform of logic high and logic low sections, wherein a duration of the logic low section corresponds to a command of the command signal.

Example 13. The control system of any one of examples 1 to 12, wherein the system controller is configured to output the command signal to adjust the conductivity modulated device on demand.

Example 14. A control system configured to control a conductivity modulated device which is configured to control energy delivery to a load, comprising a system controller configured to sense a power event in the control system and to assert a command signal in response to the sensed power event; and a switch controller coupled to the system controller and configured to receive the command signal, the switch controller further configured to control the turn on and the turn off of the conductivity modulated device to control the energy delivery to the load by variation of a rise time, a fall time, or both of a voltage across the conductivity modulated device in response to a first command in the command signal, wherein the switch controller is configured to not vary the rise time, the fall time, or both in response to a second command in the command signal.

Example 15. The control system of example 14, wherein the switch controller further comprises: an adjustable drive element configured to control the rise time, the fall time or both of the voltage across the conductivity modulated device; an interface coupled to the system controller and configured to receive the command signal, wherein the interface is configured to interpret the command signal and output a drive characteristic signal; and a drive characteristic control configured to receive the drive characteristic signal and vary the adjustable drive element to adjust the rise time, the fall time, or both of the voltage across the conductivity modulated device from a default value in response to the first command in the command signal, the drive characteristic control is configured to not vary the rise time, the fall time, or both from the default value in response to the second command in the command signal.

Example 16. The control system of example 14 or 15, wherein the adjustable drive element further comprises: a switch coupled to the drive characteristic control, wherein the drive characteristic control is configured to turn the switch ON or OFF to enable or disable the conduction of the conductivity modulated device; and a trimmable current source coupled to the drive characteristic control and coupled in series with the switch, wherein the drive characteristic control is configured to control a magnitude of current provided by the trimmable current source is controlled by the drive characteristic control in response to the drive characteristic signal to vary the rise time, the fall time, or both of the voltage across the conductivity modulated device.

Example 17. The control system of any one of examples 14 to 16, wherein the magnitude of current provided by the trimmable current source increases in response to the first command.

Example 18. A switch controller configured to control energy delivery to a load by controlling the turn on and turn off of a conductivity modulated device, the switch controller comprising: a drive characteristic control configured to receive drive characteristics from a command signal, wherein the command signal is provided to actively adjust a drive current of the conductivity modulated device; and a first drive element coupled to the drive characteristic control comprising a first switch coupled to the drive characteristic control and configured to be turned on or off to transition the conductivity modulated device from a first state to a second state; and a first trimmable current source coupled to the drive characteristic control and coupled in series with the first switch, the first trimmable current source configured to provide current for the conductivity modulated device to transition the conductivity modulated device from the first state to the second state at a first rate in response to a first command of the command signal and to provide current for the conductivity modulated device to transition the conductivity modulated device from the first state to the second state at a second rate in response to a second command of the command signal.

Example 19. The switch controller of example 18, further comprising a second drive element coupled to the drive characteristic control, wherein the second drive element comprises: a second switch coupled to the drive characteristic control and configured to be turned on or off to transition the conductivity modulated device from the second state to the first state; and a second trimmable current source coupled to the drive characteristic control and coupled in series with the second switch, the second trimmable current source is configured to provide current for the conductivity modulated device to transition the conductivity modulated device from the second state to the first state at the first rate in response to the first command of the command signal and to provide current for the conductivity modulated device to transition the conductivity modulated device from the second state to the first state at the second rate in response to the second command of the command signal.

Example 20. The switch controller of example 18 or 19, wherein the command signal is received from a system controller.

Example 21. The switch controller of any one of examples 18 to 20, wherein the command signal is received from a user toggle.

Example 22. The switch controller of any one of examples 18 to 21, wherein the command signal is received from a sensor.

The invention claimed is:

1. A switch controller coupled to control the turn on and turn off of a transistor, the switch controller comprising:
an interface coupled to receive a command signal in response to an event sensed in a control system, wherein the command signal is representative of a first command to control the transistor with a first drive strength or a second command to control the transistor with a second drive strength,
wherein the switch controller is coupled to adjust a fall time or a rise time, or to adjust both the fall time and the rise time, of a voltage across the transistor in response to the command signal, wherein the fall time or the rise time, or both the fall time and the rise time in response to the second command is shorter than the fall time or the rise time, or both the fall time and the rise time in response to the first command.

2. The switch controller of claim 1, wherein the interface is coupled to receive the command signal in response to a toggle, wherein the toggle is in response to a user.

3. The switch controller of claim 1, wherein the interface is coupled to receive the command signal in response to a toggle, wherein the toggle is in response to a dedicated hardware sensor coupled to sense the event in the control system.

4. The switch controller of claim 1, wherein the interface is coupled to a transistor to receive a toggle, wherein a base terminal of the transistor is coupled to receive the toggle and the interface is coupled to receive the command signal in response to the toggle.

5. The switch controller of claim 1, wherein the interface is coupled to receive the command signal from a system controller coupled to the switch controller, and wherein the system controller is coupled to sense the event in the control system and to assert the command signal in response to the sensed event.

6. The switch controller of claim 5, wherein the switch controller is coupled to receive the command signal from the system controller through a communication bus.

7. The switch controller of claim 1, wherein the interface is coupled to interpret the command signal and output a drive characteristic signal representative of a drive characteristic of the transistor.

8. The switch controller of claim 7, further comprising:
an adjustable drive element coupled to vary a gate current of the transistor to control the voltage across the transistor; and
a drive characteristic control coupled to receive the drive characteristic signal and to control the adjustable drive element to vary the gate current in response to the first command or the second command.

9. The switch controller of claim 8, wherein a magnitude of the gate current in response to the first command is smaller than a magnitude of the gate current in response to the second command.

10. The switch controller of claim 8, wherein the adjustable drive element comprises:
a switch, wherein the drive characteristic control is coupled to turn the switch on or off to enable or disable the conduction of the transistor; and
a trimmable current source coupled to the switch, wherein the drive characteristic control is coupled to control a current provided by the trimmable current source.

11. The switch controller of claim 10, wherein a magnitude of the current provided by the trimmable current source is responsive to the first command or the second command.

12. The switch controller of claim 10, wherein a duration of the current provided by the trimmable current source is responsive to the first command or the second command.

13. The switch controller of claim 10, wherein a frequency of the current provided by the trimmable current source is responsive to the first command or the second command.

14. A switch controller coupled to control the turn on and turn off of a transistor, the switch controller comprising:
an interface coupled to receive a command signal in response to an event sensed in a control system, wherein the command signal is representative of a first command to control the transistor with a first drive strength or a second command to control the transistor with a second drive strength,
wherein the switch controller is coupled to adjust a gate current of the transistor in response to the command signal, wherein a magnitude of the gate current in response to the first command is smaller than the magnitude of the gate current in response to the second command.

15. The switch controller of claim 14, wherein the switch controller is coupled to adjust a fall time or a rise time, or to adjust both the fall time and the rise time, of a voltage across the transistor in response to the command signal, wherein the fall time or the rise time, or both the fall time and the rise time in response to the second command is shorter than the fall time or the rise time, or both the fall time and the rise time in response to the first command.

16. The switch controller of claim 14, wherein the interface is coupled to receive the command signal in response to a toggle, wherein the toggle is in response to a user.

17. The switch controller of claim 14, wherein the interface is coupled to receive the command signal in response to a toggle, wherein the toggle is in response to a dedicated hardware sensor coupled to sense the event in the control system.

18. The switch controller of claim 14, wherein the interface is coupled to receive the command signal from a system controller coupled to the switch, controller, and wherein the system controller is coupled to sense the event in the control system and to assert the command signal in response to the sensed event.

19. The switch controller of claim 18, wherein the switch controller is coupled to receive the command signal from the system controller through a communication bus.

20. The switch controller of claim 14, wherein the interface is coupled to interpret the command signal and output a drive characteristic signal representative of a drive characteristic of the transistor.

21. The switch controller of claim 20, further comprising:
an adjustable drive element coupled to vary the gate current of the transistor to control the voltage across the transistor; and
a drive characteristic control coupled to receive the drive characteristic signal and to control the adjustable drive element to vary the gate current in response to the first command or the second command.

22. The switch controller of claim 21, wherein the adjustable drive element comprises:
a switch, wherein the drive characteristic control is coupled to turn the switch on or off to enable or disable the conduction of the transistor; and
a trimmable current source coupled to the switch, wherein the drive characteristic control is coupled to control a current provided by the trimmable current source.

23. The switch controller of claim 22, wherein a magnitude of the current provided by the trimmable current source is responsive to the first command or the second command.

24. The switch controller of claim 22, wherein a duration of the current provided by the trimmable current source is responsive to the first command or the second command.

25. The switch controller of claim 22, wherein a frequency of the current provided by the trimmable current source is responsive to the first command or the second command.

* * * * *